(12) United States Patent
Okamura et al.

(10) Patent No.: US 9,226,053 B2
(45) Date of Patent: *Dec. 29, 2015

(54) DIGITAL SPEAKER DRIVING APPARATUS

(71) Applicant: Trigence Semiconductor, Inc., Tokyo (JP)

(72) Inventors: Jun-ichi Okamura, Tokyo (JP); Akira Yasuda, Tokyo (JP)

(73) Assignee: TRIGENCE SEMICONDUCTOR, INC., Tokyo (JP)

( * ) Notice: Subject to any disclaimer, the term of this patent is extended or adjusted under 35 U.S.C. 154(b) by 384 days.

This patent is subject to a terminal disclaimer.

(21) Appl. No.: 13/665,320

(22) Filed: Oct. 31, 2012

(65) Prior Publication Data

US 2013/0058497 A1    Mar. 7, 2013

Related U.S. Application Data

(63) Continuation of application No. 12/659,813, filed on Mar. 22, 2010, now Pat. No. 8,306,244, which is a continuation of application No. PCT/JP2009/059867, filed on May 29, 2009.

(30) Foreign Application Priority Data

| Jun. 16, 2008 | (JP) | 2008-156284 |
| Dec. 10, 2008 | (JP) | 2008-314438 |
| Dec. 10, 2008 | (JP) | 2008-314905 |
| Dec. 10, 2008 | (JP) | 2008-314929 |

(51) Int. Cl.
*H04R 3/00* (2006.01)
*H04R 1/00* (2006.01)
(Continued)

(52) U.S. Cl.
CPC .............. *H04R 1/005* (2013.01); *H04R 3/12* (2013.01); *H04R 1/1008* (2013.01); *H04R 15/00* (2013.01);
(Continued)

(58) Field of Classification Search
CPC ............. G06F 17/00; H04R 3/00; H04R 3/08
USPC ........... 381/111, 120, 28, 117; 700/94
See application file for complete search history.

(56) References Cited

U.S. PATENT DOCUMENTS

| 4,555,797 A | 11/1985 | Nieuwendijk et al. ........ 381/117 |
| 4,566,120 A * | 1/1986 | Nieuwendijk et al. ........ 381/117 |

(Continued)

FOREIGN PATENT DOCUMENTS

| CN | 1204895 | 1/1999 |
| CN | 1615588 | 5/2005 |

(Continued)

OTHER PUBLICATIONS

Chinese Office Action mailed Feb. 17, 2013 for corresponding Chinese Application No. 200980100413.4.

(Continued)

*Primary Examiner* — Disler Paul
(74) *Attorney, Agent, or Firm* — TYPHA IP LLC

(57) ABSTRACT

A digital sound system suitable for a digital speaker device to directly convert analog sound by a circuit using a ΔΣ modulator and a mismatch shaping filter circuit to output a plurality of digital signals and a plurality of speakers driven by the plurality of digital signals. A digital speaker driving device includes a ΔΣ modulator, a post filter, s driving circuits, and a power supply circuit to supply power to the ΔΣ modulator, the post filter and the s driving elements, and the s driving circuits are adapted to s digital signal terminals.

29 Claims, 35 Drawing Sheets

(51) Int. Cl.
*H04R 3/12* (2006.01)
*H04R 1/10* (2006.01)
*H04R 15/00* (2006.01)
*H04R 27/00* (2006.01)

(52) U.S. Cl.
CPC ........... *H04R 27/00* (2013.01); *H04R 2227/003* (2013.01); *H04R 2499/13* (2013.01); *H04R 2499/15* (2013.01)

(56) References Cited

U.S. PATENT DOCUMENTS

| | | |
|---|---|---|
| 5,347,587 A | 9/1994 | Takahashi et al. |
| 5,404,142 A | 4/1995 | Adams et al. |
| 5,530,750 A | 6/1996 | Akagiri |
| 5,592,559 A * | 1/1997 | Takahashi et al. ............ 381/111 |
| 5,856,799 A | 1/1999 | Hamasaki et al. |
| 5,862,237 A | 1/1999 | Kishigami et al. |
| 5,872,532 A | 2/1999 | Yasuda |
| 5,909,496 A | 6/1999 | Kishigami et al. |
| 5,982,317 A | 11/1999 | Steensgaard-Madsen |
| 6,160,894 A | 12/2000 | Kishigami et al. |
| 6,292,124 B1 | 9/2001 | Hanada et al. |
| 6,476,752 B1 | 11/2002 | Eastty et al. |
| 6,563,448 B1 | 5/2003 | Fontaine |
| 6,694,028 B1 | 2/2004 | Matsuo |
| 6,697,004 B1 | 2/2004 | Galton et al. |
| 6,807,281 B1 | 10/2004 | Sasaki et al. |
| 6,930,625 B1 | 8/2005 | Lin |
| 6,940,436 B2 | 9/2005 | Hezar et al. |
| 7,058,463 B1 | 6/2006 | Ruha et al. |
| 7,081,793 B2 | 7/2006 | Morris et al. |
| 7,089,069 B2 | 8/2006 | Gabriel et al. |
| 7,091,893 B2 | 8/2006 | Seknicka |
| 7,098,828 B2 | 8/2006 | San et al. |
| 7,336,794 B2 * | 2/2008 | Furst et al. .................... 381/117 |
| 7,439,440 B2 | 10/2008 | Hsu |
| 7,492,297 B2 | 2/2009 | Lin |
| 7,696,816 B2 | 4/2010 | Bates |
| 7,710,300 B2 | 5/2010 | Kwan |
| 7,792,311 B1 | 9/2010 | Holmgren et al. |
| 7,825,986 B2 | 11/2010 | Chung |
| 7,889,109 B2 | 2/2011 | Murahashi |
| 8,098,718 B2 | 1/2012 | Sienko et al. |
| 8,306,244 B2 | 11/2012 | Okamura et al. |
| 8,423,165 B2 * | 4/2013 | Yasuda et al. .................. 700/94 |
| 8,577,483 B2 | 11/2013 | Oh et al. |
| 8,620,005 B2 | 12/2013 | Ma et al. |
| 2001/0022556 A1 | 9/2001 | Masuda |
| 2002/0084925 A1 | 7/2002 | Dedic et al. |
| 2003/0018790 A1 | 1/2003 | Nonaka |
| 2003/0122692 A1 | 7/2003 | Roeckner et al. |
| 2003/0123678 A1 * | 7/2003 | Kemmerer et al. ............. 381/86 |
| 2003/0123681 A1 | 7/2003 | Furst et al. |
| 2003/0156051 A1 | 8/2003 | Brooks et al. |
| 2003/0179891 A1 | 9/2003 | Rabinowitz et al. |
| 2004/0008859 A1 | 1/2004 | Zhao |
| 2004/0032355 A1 | 2/2004 | Melanson |
| 2004/0124915 A1 | 7/2004 | Heubi et al. |
| 2004/0131338 A1 | 7/2004 | Asada et al. |
| 2004/0136559 A1 | 7/2004 | Suzuki |
| 2005/0012545 A1 | 1/2005 | Mallinson |
| 2005/0031151 A1 | 2/2005 | Melillo |
| 2005/0075744 A1 | 4/2005 | Reefman et al. |
| 2005/0089182 A1 | 4/2005 | Troughton et al. |
| 2005/0168365 A1 | 8/2005 | Kaplan |
| 2005/0264586 A1 | 12/2005 | Kim |
| 2006/0007027 A1 | 1/2006 | Ishizuka et al. |
| 2006/0013413 A1 | 1/2006 | Sakaidani |
| 2006/0049889 A1 | 3/2006 | Hooley |
| 2006/0126878 A1 | 6/2006 | Takumai et al. |
| 2006/0149401 A1 | 7/2006 | Chung |
| 2006/0149402 A1 | 7/2006 | Chung |
| 2006/0176203 A1 | 8/2006 | Grosso et al. |
| 2006/0192703 A1 | 8/2006 | Yen |
| 2006/0290550 A1 | 12/2006 | Lee |
| 2007/0121968 A1 | 5/2007 | Na |
| 2008/0186218 A1 | 8/2008 | Ohkuri et al. |
| 2008/0219474 A1 | 9/2008 | Deruginsky et al. .......... 381/117 |
| 2009/0110217 A1 * | 4/2009 | Yasuda et al. ................. 381/120 |
| 2009/0243905 A1 | 10/2009 | Redmayne et al. |
| 2009/0296954 A1 | 12/2009 | Hooley et al. |
| 2010/0008521 A1 | 1/2010 | Cohen et al. |
| 2010/0245142 A1 | 9/2010 | Myles et al. |
| 2011/0051954 A1 | 3/2011 | Thomsen et al. |
| 2011/0150244 A1 * | 6/2011 | Lin et al. ....................... 381/120 |
| 2012/0033837 A1 | 2/2012 | Mitsui et al. |
| 2012/0099740 A1 | 4/2012 | Ma et al. |
| 2013/0156231 A1 | 6/2013 | Yasuda et al. |
| 2014/0029763 A1 | 1/2014 | Takada et al. |

FOREIGN PATENT DOCUMENTS

| | | |
|---|---|---|
| CN | 1636420 | 7/2005 |
| CN | 1702710 | 11/2005 |
| CN | 101242678 | 8/2008 |
| CN | 101542909 | 9/2009 |
| CN | 101986721 A | 3/2011 |
| CN | 1972525 B | 12/2011 |
| CN | 101242678 B | 1/2012 |
| CN | 102422650 A | 4/2012 |
| CN | 101257729 B | 3/2013 |
| CN | 103167380 A | 6/2013 |
| EP | 0712549 B1 | 11/2000 |
| EP | 1 063 866 A1 | 12/2000 |
| JP | S56-048698 A | 5/1981 |
| JP | 57-3498 | 1/1982 |
| JP | 57-138293 | 8/1982 |
| JP | 58-127795 | 8/1983 |
| JP | 2-121497 | 5/1990 |
| JP | H03-066297 A | 3/1991 |
| JP | 3-216025 | 9/1991 |
| JP | 4-35599 | 12/1992 |
| JP | 5-145988 | 6/1993 |
| JP | 5-176387 | 7/1993 |
| JP | H05-199575 A | 8/1993 |
| JP | 6-335082 | 12/1994 |
| JP | 7-131881 | 5/1995 |
| JP | 8-65791 | 3/1996 |
| JP | 8-154058 | 6/1996 |
| JP | 9-46787 | 2/1997 |
| JP | 9-501287 | 2/1997 |
| JP | 9-186601 | 7/1997 |
| JP | 10-13986 | 1/1998 |
| JP | H10-051888 A | 2/1998 |
| JP | 10-276490 | 10/1998 |
| JP | 11-502981 | 3/1999 |
| JP | 11-112245 | 4/1999 |
| JP | 11-122110 | 4/1999 |
| JP | 11-262084 | 9/1999 |
| JP | 2000-78015 | 3/2000 |
| JP | 2000-228630 | 8/2000 |
| JP | 2000-269761 | 9/2000 |
| JP | 2000-295049 | 10/2000 |
| JP | 2000-341129 | 12/2000 |
| JP | 2000-341794 | 12/2000 |
| JP | 2001-16675 | 1/2001 |
| JP | 2001-36409 | 2/2001 |
| JP | 2002-504277 | 2/2002 |
| JP | 2002-216026 A | 8/2002 |
| JP | 2002-374170 | 12/2002 |
| JP | 2003-513502 | 4/2003 |
| JP | 2003-216163 | 7/2003 |
| JP | 2003-324788 | 11/2003 |
| JP | 2004-135066 | 4/2004 |
| JP | 2004-172786 | 6/2004 |
| JP | 2004-221651 | 8/2004 |
| JP | 2004-222251 A | 8/2004 |
| JP | 2005-64746 | 3/2005 |
| JP | 2005-338763 | 12/2005 |
| JP | 2006-19988 | 1/2006 |
| JP | 2006-067008 A | 3/2006 |
| JP | 2006-109275 | 4/2006 |
| JP | 2006-303618 | 11/2006 |

(56) References Cited

FOREIGN PATENT DOCUMENTS

| JP | 2006-338763 | 12/2006 |
|---|---|---|
| JP | 2006-339852 A | 12/2006 |
| JP | 2008-67041 | 3/2008 |
| JP | 2008-193160 A | 8/2008 |
| JP | 2009-147928 | 7/2009 |
| JP | 2009-538553 | 11/2009 |
| JP | 2010-263332 | 11/2010 |
| JP | 2012-227589 | 11/2012 |
| JP | 2013-157972 | 8/2013 |
| JP | 2013-543715 | 12/2013 |
| WO | WO 95/05034 | 2/1995 |
| WO | 96/31086 | 10/1996 |
| WO | WO 01/31793 A1 | 5/2001 |
| WO | WO 03/071827 A2 | 8/2003 |
| WO | 2007/135928 A1 | 11/2007 |
| WO | WO 2007/135928 A1 | 11/2007 |
| WO | WO 2007/135928 A9 | 11/2007 |

OTHER PUBLICATIONS

Japanese Office Action issued Jul. 15, 2014 in Japanese Patent Application No. 2013-229250.
Japanese Office Action issued Jul. 15, 2014 in Japanese Patent Application No. 2011-510758.
Chinese Office Action issued May 6, 2014 in Chinese Patent Application No. 201080029610.4.
U.S. Office Action issued Jul. 22, 2014 in a co-pending U.S. Appl. No. 13/552,270.
U.S. Office Action issued Jul. 14, 2014 in a co-pending U.S. Appl. No. 13/221,335.
European Office Action issued Jul. 22, 2014 in corresponding European Patent Application No. 10788219.3.
Chinese Office Action issued Jun. 23, 2014 in corresponding Chinese Patent Application No. 201080001918.8.
Extended European Search Report mailed Jul. 31, 2013 in corresponding European Application No. 10788219.3.
Extended European Search Report mailed Dec. 11, 2013 in corresponding European Application No. 10835733.6.
Japanese Office Action mailed Aug. 20, 2013 in corresponding Japanese Application No. 2008-314438.
Japanese Office Action mailed Aug. 20, 2013 in corresponding Japanese Application No. 2008-314929.
Japanese Office Action mailed Sep. 10, 2013 in corresponding Japanese Application No. 2011-510759.
U.S. Office Action mailed Jan. 9, 2013 a possible related U.S. Appl. No. 12/929,070.
International Search Report for PCT/JP2009/059867, mailed Aug. 4, 2009.
Takesaburo Yanagisawa et al., "Piezo-Electric Type Digital Loudspeaker and Dynamic Responses as Digital-to-Analog Converter", Transactions of the Institute of Electronics, Information and Communication Engineers, vol. 72, No. 11, Nov. 1989, pp. 1724-1732.
Takesaburo Yanagisawa et al., "Possibility of Multi-Bits in Piezo-Electric Type Digital Loudspeaker with Compound Driving System", Transactions of the Institute of Electronics, Information and Communication Engineers, vol. 74, No. 6, Jun. 1991, pp. 913-915.
Takesaburo Yanagisawa et al., "Piezo-Electric Type Loudspeaker Driven by 16 bits Digital Signal and Its Acoustic Responses", Transactions of the Institute of Electronics, Information and Communication Engineers, vol. J76-A, No. 9, Sep. 1993, pp. 1392-1395.
Hajime Ueno et al., "Digital-driven piezoelectric speaker using multi-bit delta-sigma modulation", The 121st Convention of Audio Engineering Society, Oct. 2006, pp. 1-6.
Kazushige Kuroki et al., "A Digitally Direct Driven Small Loud Speaker", The 13th Regional Convention of Audio Engineering Society, Jul. 2007, pp. 1-6.
Ryota Saito et al., "A Digitally Direct Driven Dynamic-type Loudspeaker", The 124th Convention of Audio Engineering Society, May 2008, pp. 1-8.
Ichiro Fujimori et al., "A Multibit Delta-Sigma Audio DAC with 120-dB Dynamic Range", IEEE Journal of Solid-State Circuits, Aug. 2000, pp. 1-9.
Masanori Shibata et al., "A Cascaded Delta-Sigma DAC with an analog FIR filter reducing mismatch-effects", IEEE, Aug. 2005, pp. 1-5.
Tsuyoshi Soga et al., "A direct digital speaker", Acoustical Society of Japan, Sep. 2005, pp. 1-6.
Pieter Rombouts et al., A Study of Dynamic Element-Matching Techniques for 3-level Unit Elements, IEEE Transaction on Circuits and Systems, vol. 47, No. 11, Nov. 2000, pp. 1177-1187.
Japanese Office Action mailed Nov. 9, 2010 issued in corresponding Japanese Patent Application No. 2008-516630.
Japanese Office Action mailed May 11, 2010 issued in corresponding Japanese Patent Application No. 2008-310147.
Japanese Office Action mailed Nov. 9, 2010 issued in corresponding Japanese Patent Application No. 2008-310147.
Japanese Office Action mailed Mar. 16, 2010 issued in corresponding Japanese Patent Application No. 2008-516630.
Restriction Requirement mailed from the Unites States Patent and Trademark Office on Dec. 27, 2011 in the related U.S. Appl. No. 12/659,813.
Office Action mailed from the Unites States Patent and Trademark Office on Feb. 6, 2012 in the related U.S. Appl. No. 12/659,813.
Notice of Allowance mailed from the Unites States Patent and Trademark Office on Jul. 9, 2012 in the related U.S. Appl. No. 12/659,813.
U.S. Appl. No. 12/659,813, filed Mar. 22, 2010, Jun-ichi Okamura et al., Trigence Semiconductor, Inc.
U.S. Appl. No. 12/285,323, filed Oct. 1, 2008, Akira Yasuda, Trigence Semiconductor, Inc.
U.S. Appl. No. 12/929,070, filed Dec. 28, 2010, Akira Yasuda, Trigence Semiconductor, Inc.
U.S. Appl. No. 13/221,335, filed Aug. 30, 2011, Akira Yasuda, Trigence Semiconductor, Inc.
Chinese Office Action dated Nov. 15, 2014 in Chinese Patent Application No. 201080029610.4.
Chinese Office Action dated Dec. 3, 2014 in Chinese Patent Application No. 201210087070.6.
Extended European Search Report dated Nov. 4, 2014 in European Patent Application No. 09766515.2.
U.S. Office Action issued Sep. 24, 2014 in co-pending U.S. Appl. No. 12/929,070.
U.S. Office Action mailed Jan. 13, 2014 in a possible related U.S. Appl. No. 13/221,335.
Japanese Office Action dated Jan. 20, 2015 in corresponding Japanese Patent Application No. 2011-510758.
Chinese Notice of Allowance dated Jan. 8, 2015 in corresponding Chinese Patent Application No. 201210086644.8.
Chinese Office Action dated Dec. 3, 2014 in corresponding Chinese Patent Application No. 201210549780.6.
Japanese Notice of Allowance dated Feb. 17, 2015 in corresponding Japanese Patent Application No. 2014-098585.
Japanese Office Action dated Feb. 3, 2015 in corresponding Japanese Patent Application No. 2014-115496.
Chinese Notice of Allowance dated Feb. 2, 2015 in corresponding Chinese Patent Application No. 201210086679.1.
European Summons to Attend Oral Proceedings dated Feb. 9, 2015 in corresponding European Patent Application No. 10788219.3.
Partial English Translation of Japanese Patent Application No. 57-3498, Reference AF in the IDS filed on Sep. 22, 2014.
Japanese Office Action dated Mar. 3, 2015 in corresponding Japanese Patent Application No. 2014-081167.
Korean Office Action dated Apr. 1, 2015 in corresponding Korean Patent Application No. 10-2010-7005223.
Chinese Office Action dated Mar. 9, 2015 in corresponding Chinese Patent Application No. 201080001918.8.
Japanese Notice of Allowance dated Apr. 14, 2015 in corresponding Japanese Patent Application No. 2014-115496.
U.S. Office Action dated Apr. 28, 2015 in co-pending U.S. Appl. No. 13/221,335.
U.S. Office Action dated Jun. 18, 2015 in co-pending U.S. Appl. No. 13/763,083.
Office Action dated Aug. 26, 2015 regarding a corresponding Chinese Patent Application No. 201210549780.6.

(56) References Cited

OTHER PUBLICATIONS

Office Action dated Sep. 8, 2015 regarding a corresponding Japanese Patent Application No. 2014-185599.
Office Action dated Sep. 14, 2015 regarding a corresponding Chinese Patent Application No. 201280001918.8.
Office Action dated Oct. 7, 2015 regarding a co-pending U.S. Appl. No. 14/722,780.
Office Action dated Oct. 13, 2015 regarding a corresponding Korean Patent Application No. 10-2010-7005223.
Notice of Reasons for Refusal dated Oct. 27, 2015 regarding a corresponding Japanese Patent Application No. 2014-211709.

* cited by examiner

DIGITAL SPEAKER DRIVING APPARATUS

CROSS-REFERENCE TO RELATED APPLICATIONS

This application is a continuation of and claims priority benefit to U.S. patent application Ser. No. 12/659,813, filed Mar. 22, 2010, allowed, which application in turn is a continuation based on and claims priority benefit to PCT Application No. PCT/JP2009/059867, filed on May 29, 2009, that application in turn claiming foreign priority benefit from prior Japanese Patent Application No. 2008-156284, filed on Jun. 16, 2008, Japanese Patent Application No. 2008-314438, filed on Dec. 10, 2008, Japanese Patent Application No. 2008-314905, filed on Dec. 10, 2008, and Japanese Patent Application No. 2008-314929, filed on Dec. 10, 2008, the entire contents of which are incorporated herein by reference.

BACKGROUND

1. Field

The present invention is related to a digital speaker driving apparatus, a digital speaker apparatus, an actuator, a flat display apparatus, and a mobile electronic device. Specifically, the present invention is related to a digital acoustic system and applications thereof in which a digital speaker apparatus which directly converts a digital signal into an analog audio is used.

2. Description of the Related Art

The digital speaker technology which directly converts a digital signal into an analog audio has been proposed.

In WO2007/135928A, a method is shown in which an analog audio is directly converted with a circuit inputting two digital audio signals X (L) and Y (R) and outputting a plurality of digital signals, the circuit comprising a ΔΣ modulator and a miss-match shaping filter circuit, and a plurality of speakers driven by the plurality of digital signals or a plurality of driving elements.

In addition to having a characteristic of low power consumption compared to an analog speaker apparatus driven by an analog electric signal, because a plurality of speaker elements or plurality of driving elements (coils etc) are used, such a digital speaker apparatus, which directly converts a digital signal into an analog audio by using the digital speaker technology, can produce a large sound pressure at a low driving voltage, compared to a speaker which uses a conventional one speaker element or single driving element driven by an analog electric signal.

However, because it is presumed that an analog signal is input in a conventional speaker apparatus, it is necessary to convert the input analog signal into a digital signal in order to integrate a digital speaker apparatus into a conventional digital acoustic system, a significant problem arises when realizing a digital acoustic system which uses a digital speaker apparatus.

Typical examples of digital acoustic systems which use conventional analog speaker apparatuses are shown in FIG. 1a to FIG. 1c. FIG. 1a shows a first embodiment of a digital acoustic system which uses a digital signal source and an analog speaker apparatus. In this example, a signal from the digital signal source is converted to an analog signal by a D/A convertor and the signal is input to an analog speaker apparatus after the amplitude of the signal is amplified by an analog amplifier. This embodiment is best suited to an acoustic system which uses a conventional analog amplifier and a speaker.

FIG. 1b shows a second embodiment of a digital acoustic system which uses a digital signal source and an analog speaker apparatus. In this example, a digital signal from a digital signal source is converted to an analog signal by a D/A convertor and input to an amplifier. In the amplifier, after the input analog signal is once converted to a digital signal by an A/D convertor, the signal is PWM modulated and the amplitude digitally amplified (D-class amplification) and then converted back to an analog signal by the D/A convertor (usually an LC filter) and input to an analog speaker apparatus. It is a more complex system compared with FIG. 1a, however, the digital amplitude amplification (D-class amplification) has higher power efficiency and the amplifier can operate with less power and with smaller space compared to an analog amplifier and therefore has become gradually used in recent years.

FIG. 1c shows a third embodiment of a digital acoustic system which uses a digital signal source and an analog speaker apparatus. In this example, a signal from the digital single source is input directly as a digital signal to an amplifier. In the amplifier, after the input signal is PWM modulated, the signal is converted to an analog signal by a D/A convertor (usually an LC filter) after the amplitude of the signal is digitally amplified (D-class amplification) and input to an analog speaker apparatus. In a digital device such as a personal computer or a mobile phone, a digital signal source and an amplifier for the internet or data transmission are often arranged within the same device and this type of system is being widely used.

In FIG. 1b and FIG. 1c, after the amplitude is digitally amplified (D-class amplification), a signal is converted to an analog signal by a D/A convertor (usually an LC filter) and input to an analog speaker apparatus, however, the digital amplitude amplification must be done with a high voltage in order to output a large sound pressure, a digital amplitude amplification semiconductor device which uses a high voltage special semiconductor technology is required and it is difficult to lower costs. In addition, when digital amplitude amplification is performed with a high voltage, electromagnetic irradiation becomes large and additional costs are incurred in order to reduce this electromagnetic irradiation.

In these conventional examples, because an analog signal is used as a signal input to a speaker apparatus, it is necessary to convert the analog signal which is input to the speaker apparatus to a digital signal when a digital speaker apparatus which uses a circuit which outputs a plurality of digital signals by a ΔΣ modulator and a miss-match shaping filter circuit as disclosed in WO2007/13528A1, and a plurality of speakers driven by a plurality of digital signals is used, and therefore an A/D convertor must be further added to realize the digital speaker apparatus and the power consumed by the newly required A/D convertor increases and the digital speaker apparatus becomes complex. In addition, there is a problem in which a deterioration in sound quality between an analog signal and a digital signal in the A/D (D/A) convertor between the digital signal source and the digital speaker apparatus can not be avoided.

SUMMARY

The present invention discloses a digital acoustic system appropriate for a digital speaker apparatus which directly converts into an analog audio, the digital acoustic system including a circuit which outputs a plurality of digital signals by a ΔΣ modulator and a miss-match shaping filter circuit, and one or a plurality of speakers which are driven by the plurality of digital signals.

In one embodiment of the present invention, a digital speaker driving apparatus which drives a digital speaker having s number of digital signal terminals is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; and wherein the s number of driving circuits correspond to the s number of digital signal terminals.

In addition, it is preferred that by supplying a variable voltage to the s number of driver elements by a power circuit arranged on the digital speaker driving apparatus, the amplitude of an output of a digital signal of the s number of driver circuits is adjusted. Furthermore, it is preferred that a digital attenuator be included which adjusts the volume of a digital speaker by inputting a digital input signal to the ΔΣ modulator after performing a calculation process. Furthermore, it is preferred that a power circuit be controlled according to a digital input signal.

In one embodiment of the present invention, a digital speaker driving apparatus which is connected to a digital signal terminal of a digital speaker is disclosed having a first output circuit connected to a first input terminal of the digital terminals of the digital speaker; and a second output circuit connected to a second input terminal of the digital terminals of the digital speaker, the second input terminal forming a pair with the first input terminal; wherein the first output circuit and the second output circuit are input with signals, the signals being inversed with each other.

Furthermore, it is preferred that the first output circuit and the second output circuit output signals of a first voltage, a second voltage, or a third voltage, in the case where the first output circuit outputs the first voltage and the second output circuit outputs the third voltage, the state of the digital signal output is in a first state, in the case where the first output circuit outputs the third voltage and the second output circuit outputs the first voltage, the state of the digital signal output is in a second state, and in the case where both of the first output circuit and the second output circuit output the second voltages, the state of the digital signal output is in a third state.

Furthermore, in the digital speaker driving apparatus stated above, it is preferred that the ΔΣ modulator, the post filter, and the s number of driving circuits are formed on a single semiconductor or are sealed in a single package.

In one embodiment of the present invention, a digital speaker apparatus includes a digital speaker having a plurality of input terminals; and a digital speaker driving circuit which is connected to the input terminals and drives the digital speaker; wherein the digital speaker driving circuit is arranged just behind coils of the digital speaker.

In one embodiment of the present invention, a digital speaker apparatus is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; s number of speaker driving elements each of which is driven by a corresponding driving circuit among the s number of driving circuits; and r number of vibration membranes which are driven by the s number of driving elements; wherein s and r are 2 or more.

In one embodiment of the present invention, a digital speaker apparatus is disclosed including a ΔΣ modulator; and a digital speaker; wherein the digital speaker has a plurality of coils each of which is driven by a different digital signal and all of which vibrate a common vibration membrane.

It is preferred that the plurality of coils are bound together and wound.

In one embodiment of the present invention, a digital actuator is disclosed having a magnetostrictor, and a plurality of coils which are each driven by different digital signals and which generate a magnetic field to the magnetostrictor.

In one embodiment of the present invention, a digital speaker apparatus is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; and s number of electrostatic elements each of which is driven by a corresponding driving circuit among the s number of driving circuits.

In the digital speaker apparatus stated above, it is preferred that the ΔΣ modulator, the post filter, and the s number of driving circuits and the s number of electrostatic elements are formed on a single substrate.

In one embodiment of the present invention, a digital speaker driving apparatus which drives a digital speaker having s number of digital signal terminals is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuit which delays the m bit digital signal and outputs the delayed m bit digital signal; s number of driving circuits to each of which one part of the m bit digital signal is input and each of which outputs a digital signal; wherein a delay time period of the digital delay control circuit is controlled for each output according to a control signal.

In one embodiment of the present invention, a flat display apparatus is disclosed including a flat display; a plurality of digital speakers which are arranged in a line on at least one side of the flat display; and a delay control circuit which controls the delay time periods of driving signals supplied to the plurality of digital speakers according to a control signal.

In one embodiment of the present invention, a digital speaker apparatus is disclosed including a port for connecting to a portable digital audio source apparatus; a circuit for processing the digital signals input to the port in a digital format; and a digital speaker driven by the circuit; wherein the digital speaker apparatus operates with a battery.

In one embodiment of the present invention, a mobile electronic device is disclosed including a digital speaker; and a driving apparatus which drives the digital speaker without converting a digital signal to an analog signal; wherein the portable electronic device operates with a battery.

In one embodiment of the present invention, a mobile electronic device is disclosed including a port for connecting to a portable digital audio source apparatus; a driving apparatus for processing the digital signals input to the port in a digital format; and a digital speaker driven by the driving apparatus; wherein the portable electronic device operates with a battery.

In one embodiment of the present invention, a digital speaker apparatus is disclosed including a digital speaker; a digital speaker driving apparatus for processing a digital signal without converting the digital signal to an analog signal;

and a microphone; wherein the digital speaker driving apparatus operates so that a noise is cancelled based on a signal from the microphone.

In one embodiment of the present invention, a mobile electronic device is disclosed including a wireless receiver receiving a digital signal; a digital speaker driving apparatus which generates a plurality of digital signals without converting the digital signal output by the wireless receiver to an analog signal; and a digital speaker which is driven by the plurality of digital signals.

In addition, in one embodiment of the present invention, a digital speaker system which drives a digital speaker including s number of groups of a digital signal terminal arranged with a group including a first input terminal and a second input terminal is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; and s number of driving circuits each of which corresponds to one of the s pairs of digital input terminals and to each of which one part of the m bit digital signal is input and each of which outputs a digital signal; wherein each of s number driving circuits has a first output circuit connected to a first input terminal of a corresponding digital input terminal and a second output circuit connected to a second input terminal which forms a pair with the first input terminal of a corresponding digital input terminal; and wherein the driving circuit has at least three states of digital signal output according to the combination of a first digital signal input to the first output circuit and a second digital signal input to the second output circuit.

In addition, in one embodiment of the present invention, a digital speaker apparatus which drives a plurality of digital speakers including s number of digital signal terminals respectively is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuits which delays the m bit digital signal and outputs the delayed m bit digital signal; s number of driving circuits to each of which a part of the delayed m bit digital signal is input and each of which outputs a digital signal; and a sensor which senses information related to a person or an object which exists in a periphery; wherein a delay time period of the digital delay control circuit is controlled according to a control signal generated based on the information sensed by the sensor, and the directionality of audio played back by the plurality of digital speakers is controlled to a direction or position of the person or the object detected by the sensor.

In addition, in one embodiment of the present invention, a digital speaker driving apparatus which drives a digital speaker having s number of digital signal terminals is disclosed including a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuit which delays the m bit digital signal and outputs the delayed m bit digital signal; s number of driving circuits to each of which a part of the delayed m bit digital signal is input and each of which outputs a digital signal; and a microphone which detects a sound in a periphery; wherein an audio of an opposite phase to the sound detected by the microphone is generated by the digital speaker.

In this case, another digital speaker may be arranged, and the digital speaker driving apparatus may include a plurality of digital speakers, wherein the digital delay control circuit outputs an m bit digital signal which is delayed for each digital speaker by controlling the delay time period of the m bit digital signal input.

Furthermore, one embodiment of a digital acoustic system using a digital signal source and a digital speaker apparatus of the present invention is shown in FIG. 1d. In the present invention, the signal of a digital signal source is input to the digital speaker apparatus as a digital signal. The digital speaker apparatus directly converts an input digital signal to analog audio without converting to an analog signal.

According to the present invention, it becomes possible to reduce the costs of the digital acoustic system because it is possible to manufacture a digital acoustic system by combining with a simple apparatus compared to a conventional analog acoustic system without losing low power consumption characteristics which are the original characteristics of a digital speaker. It is possible to reduce the costs of a digital speaker driving apparatus, which is required for the digital acoustic system, because a large sound pressure with a low driving voltage is possible in the digital speaker apparatus, and because it is not necessary to use any special semiconductor technology for handling a high voltage in the case where a digital signal process circuit is formed monolithically on a semiconductor It is possible to reduce costs for suppressing electromagnetic irradiation because electromagnetic irradiation (EMI) is small due to driving with a low driving voltage. It is possible to avoid a deterioration in sound quality because there is no A/D (D/A) convertor between a digital signal source and a digital speaker apparatus.

DESCRIPTION OF EMBODIMENTS

The embodiments of the present invention are explained below with references to the drawings. Furthermore, the invention is not limited to these embodiments. The present invention can be achieved with various modifications to the embodiments below based on technologies related to the invention.

First Embodiment

Figure 1A:
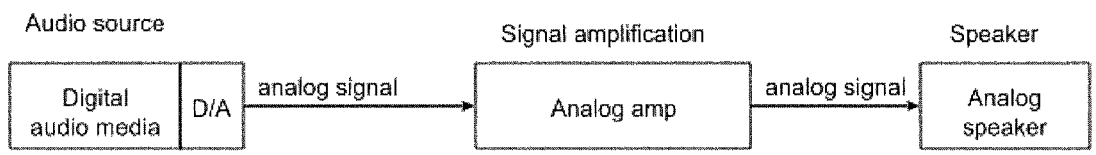
FIG. 1a is an exemplary diagram of a structure of a digital acoustic system.
Figure 1B:
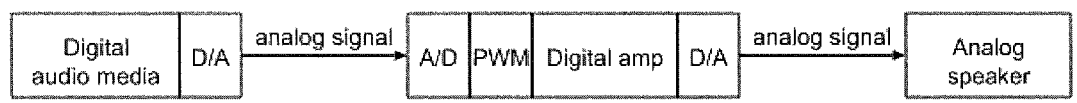
FIG. 1b is an exemplary diagram of a structure of a digital acoustic system.
Figure 1C:
FIG. 1c is an exemplary diagram of a structure of a digital acoustic system.
Figure 1D:
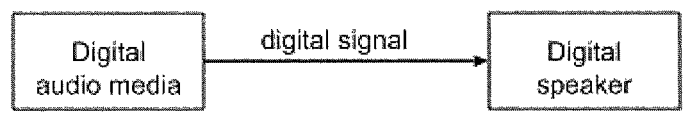
FIG. 1d is a structural diagram of a digital acoustic system related to one embodiment of the present invention.
Figure 1E:
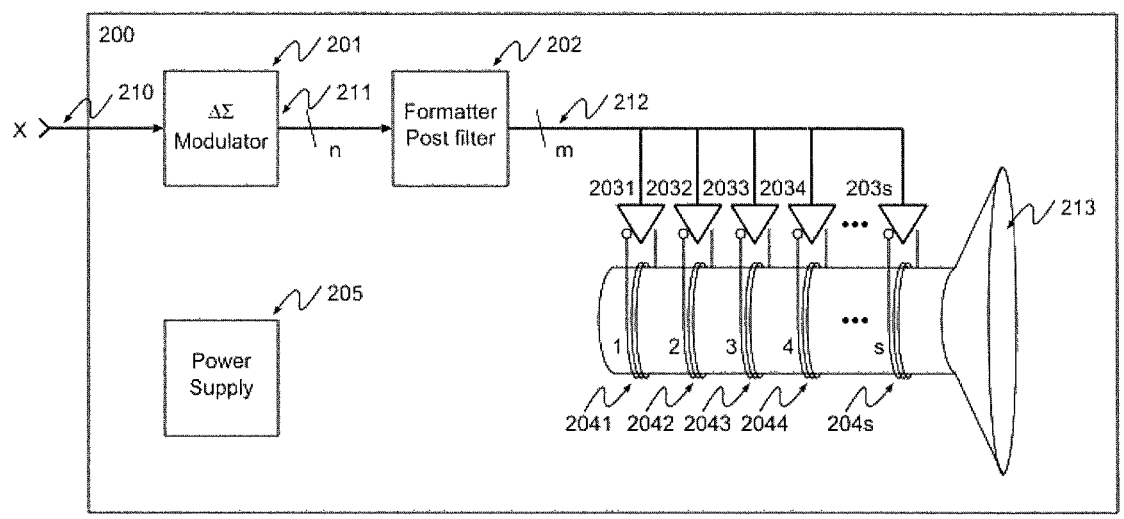
FIG. 1e is a structural diagram of a digital acoustic system related to one embodiment of the present invention.

FIG. 1e shows a first embodiment of a digital speaker apparatus system including a circuit for outputting a plurality of digital signals by a ΔΣ modulator and a post filter circuit, and a plurality of speaker driving elements. A 1 bit digital input signal (210) is input to a ΔΣ modulator (201) and converted to a plurality of n bit digital signals (211) by the ΔΣ modulator (201). The plurality of n bit digital signals are converted to m bit digital signals (212) which have been miss-match shaped by a post filter (202). The m bit digital signals (212) drive s number of driving elements (2041-204s) by speaker driving circuits (2031-203s) and an analog audio is directly converted by a vibration membrane (213). The ΔΣ modulator (201), the post filter (202), the speaker driving circuits (2031-203s), and a power supply circuit (205) which supplies power to these circuits are structural components of a digital speaker apparatus (200).

Furthermore, it is possible for each of the digital signals input to the s number of speaker driving circuits (2031-203s) to be at the same level at a certain moment. However, it is possible that a change in each of the digital signals input to the s number of speaker driving circuits (2031-203s) during a sufficiently long period of time is not the same. In this way, it is possible to reduce the consumption of wasteful power by the driving elements (2041-204s). For example, in the case where the same digital signal is input to a number n of s speaker driving circuits (2031-203s), the power larger by n times than the power which is wastefully consumed by each driving element is wastefully consumed is prevented. This can also be said concerning the other embodiments.

Figure 2A:
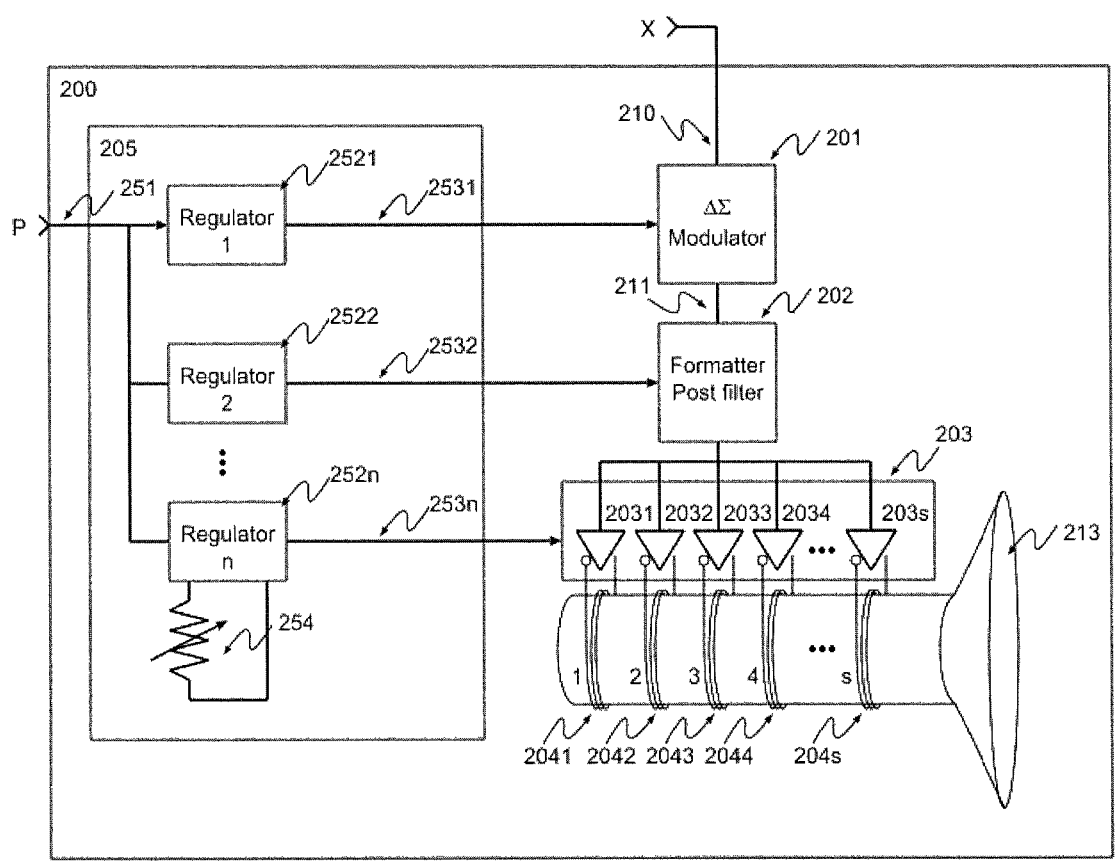
FIG. 2a is a structural diagram of a power circuit of a digital acoustic system related to a first embodiment of the present invention.

The internal structure of the power supply circuit (205) in the first embodiment is shown in FIG. 2a. A power source (251) from an external power source or a battery has a plurality of regulator circuits (2521-252n) and is supplied to the ΔΣ modulator (201), the post filter (202), and speaker driving circuits (2031-203s) via supply lines (2531-253n). The regulator circuit (252a) which supplies a power to the speaker driving circuits (2031-203s) can have a means (254) for varying a supply voltage. In this way, it is possible to adjust the amplitude of a digital signal which drives a digital speaker and it is possible to adjust the volume of the digital speaker.

Second Embodiment

Figure 2B:
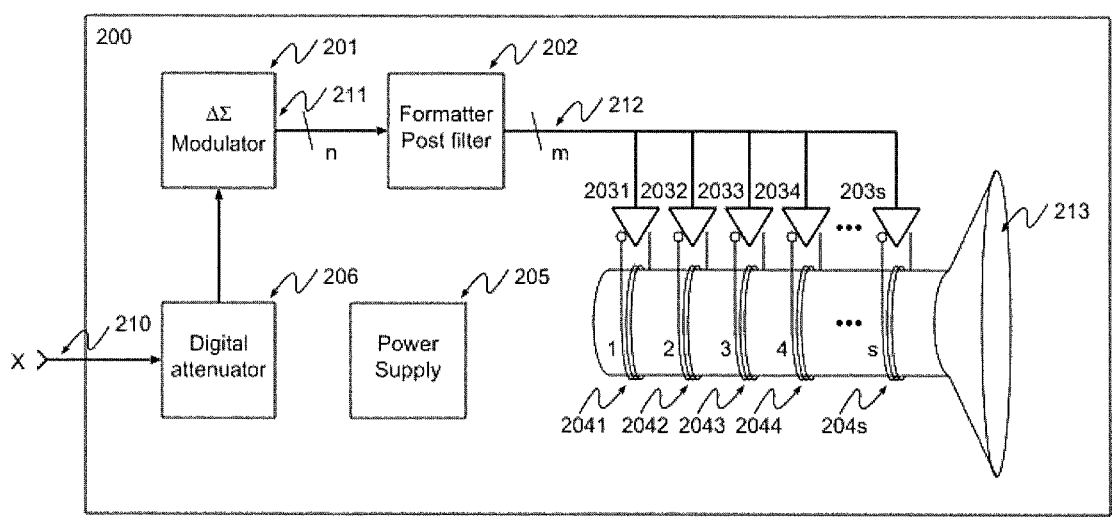
FIG. 2b is a structural diagram of a power circuit of a digital acoustic system related to a second embodiment of the present invention.

FIG. 2b shows a second embodiment of a digital speaker apparatus system including a circuit which outputs a plurality of digital signals by a ΔΣ modulator and a post filter circuit, and a plurality of speaker driving elements. In the present embodiment, in order to adjust the volume of a digital speaker, the volume is digitally adjusted from a 1 bit digital input signal (210) input to the digital speaker apparatus, even though the regulator circuit (252a) which supplies a power for the speaker driving circuits (2031-203s) is not equipped with a means (254) for varying a supply voltage.

Third Embodiment

Figure 2C:
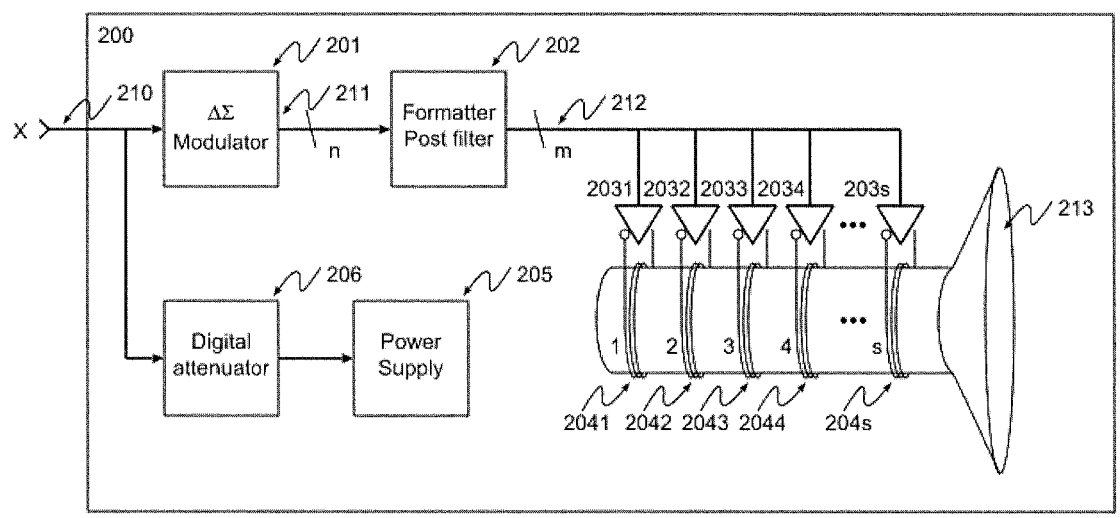
FIG. 2c is a structural diagram of a power circuit of a digital acoustic system related to a third embodiment of the present invention.

FIG. 2c shows a third embodiment of a digital speaker apparatus system including a circuit which outputs a plurality of digital signals by a ΔΣ modulator and a post filter circuit, and a plurality of speaker driving elements. In the present embodiment, in order to adjust the volume of a digital speaker, the volume is digitally adjusted based on information of a 1 bit digital input signal (210) input to the digital speaker apparatus, as a means (210) for varying a supply voltage of the regulator circuit (252a) which supplies a power for the speaker driving circuits (2031-203s).

Figure 3A:
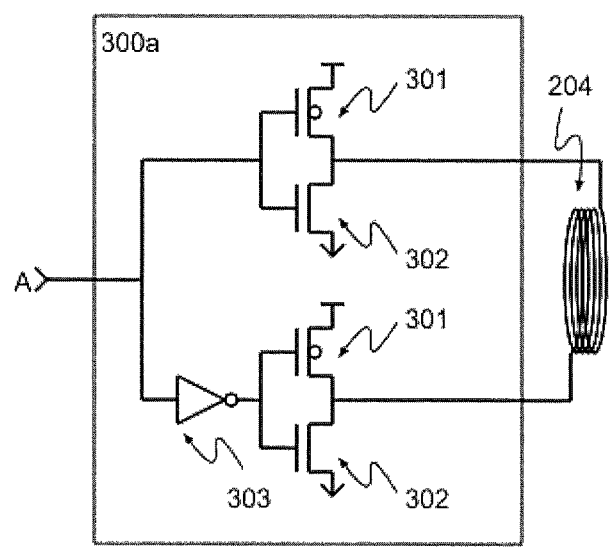
FIG. 3a is a structural diagram of a speaker driving circuit of a digital acoustic system related to one embodiment of the present invention.

When each of the speaker driving circuits (2031-203s), which are shown in FIG. 2a to FIG. 2c, is 2-valued (−1, 1), it is possible to have s+1 levels as a digital speaker driving state. In this case, m=s and the relationship 2n>(s+1) is satisfied in the ΔΣ modulator. An embodiment of a speaker driving circuit (300a) which has a 2-valued driving state is shown in FIG. 3a. Two types of switch circuit including a PMOS element (301) and an NMOS element (302) are each connected to a speaker driving element (204) via an output terminal. An input signal A which is the 2-valued digital signal is connected to the input of one of the switch circuits via an inverter circuit (303). The speaker driving circuit (300a) has a 2 valued state (-1, 1) according to the state of the input signal A.

When each of the speaker driving circuits (2031-203s), which is shown in FIG. 2a to FIG. 2c, is 3 valued (-1, 0, 1), it is possible to have 2×s+1 levels as a digital speaker driving state. In this case, m=2×s and the relationship 2n>(2×s+1) is satisfied in the ΔΣ modulator. An embodiment of a speaker driving circuit (300b) which has a 3-valued driving state is shown in FIG. 3a. Two types of switch circuit including a PMOS element (301) and an NMOS element (302) are each connected to a speaker driving element (204) via an output terminal. An input signal A which is a 2-valued digital signal is connected to the input of each of the switch circuits via a buffer circuit (304b) and an inverter circuit (303) with enable terminals. The speaker driving circuit (300b) has one of 3-valued states (-1, 0, 1) according to the state of the input signals A and B. This type of circuit is generally called an H bridge circuit.

Figure 3B:
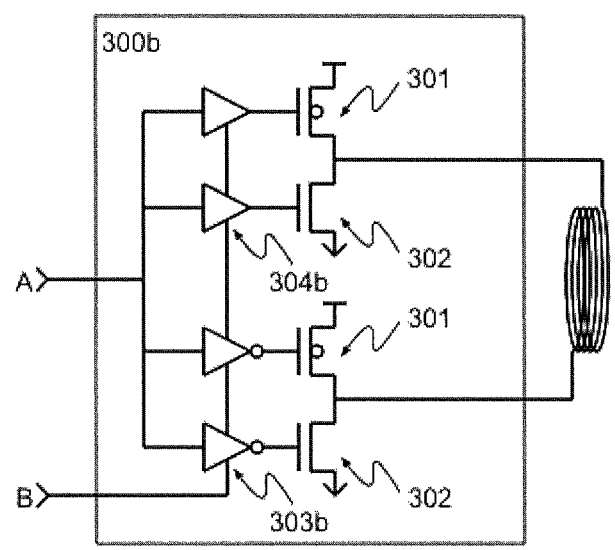
FIG. 3b is a structural diagram of a speaker driving circuit of a digital acoustic system related to another embodiment of the present invention.

A PMOS and an NMOS which are complementary MOS transistors are used in the type of switch circuit shown in FIG. 3a and FIG. 3b. However, it is possible to form the switch circuit using only NMOS transistors or only PMOS transistors. In addition, it is possible to form the switch circuit using a switching element which uses a semiconductor other than a MOS transistor.

In an embodiment of a digital speaker apparatus, which is shown in FIG. 2a to FIG. 2c, including a ΔΣ modulator, a post filter circuit, a plurality of speaker driving circuits and driving elements, because a plurality of transmission signals are required after the ΔΣ modulator, it is preferred that the ΔΣ modulator, the post filter circuit, and the plurality of speaker driving circuits are formed as one unit in order to reduce the number of required wires. It is possible to reduce the number of required signal wires by forming a digital signal processing circuit including the ΔΣ modulator, the post filter circuit, the plurality of speaker driving circuits and driver elements as one part on a semiconductor or by sealing in the same package.

Fourth Embodiment

Figure 4A:
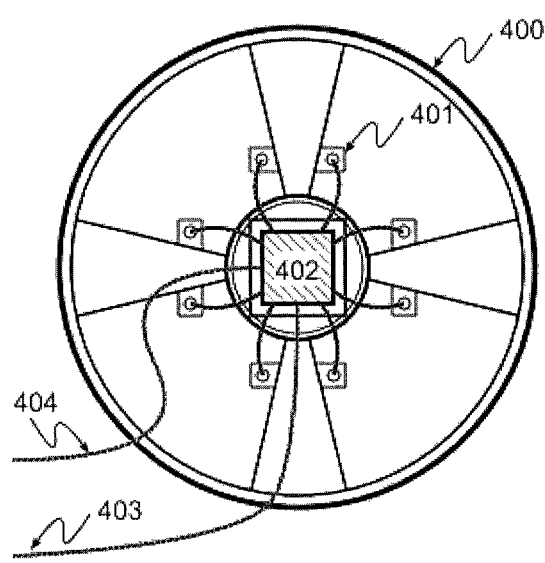
FIG. 4a is a structural diagram of a digital acoustic system related to a fourth embodiment of the present invention.
Figure 4B:
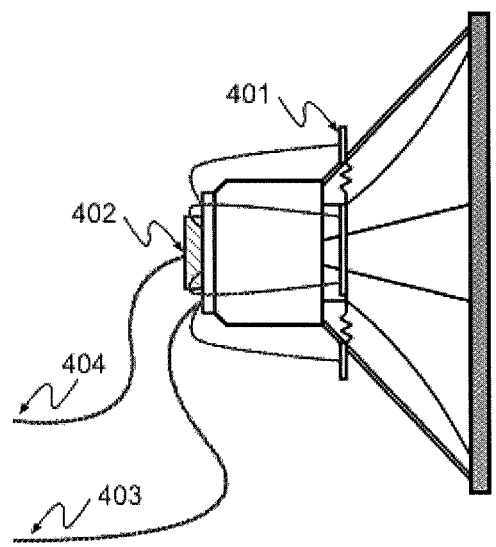
FIG. 4b is a structural diagram of a digital acoustic system related to a fourth embodiment of the present invention.

A fourth embodiment of a digital speaker apparatus including a ΔΣ modulator, a post filter circuit, a plurality of speaker driving circuits and driving elements is shown in FIG. 4a (a back surface view) and FIG. 4b (side surface view) as an embodiment of a system including a digital speaker driving apparatus (400), which is formed with a ΔΣ modulator and a post filter circuit as one unit formed on a semiconductor or sealed in the same package, and a digital speaker apparatus (402) including a plurality of speaker driving elements. A 1 bit digital input signal (403) is input into the digital speaker driving apparatus (402) housing the ΔΣ modulator, the post filter circuit, the driving circuit of a plurality of digital signals, and a plurality of digital speaker driving signals (401) are output. A power supply line (404) supplies a power to the digital speaker driving circuit (402). The digitals speaker driving circuit (402) is arranged near the speaker driving elements so that the distance between the plurality of digital speaker driving signals (401) and speaker driving elements becomes smaller. It is possible to make the wiring distance as small as possible by arranging the digital speaker driver circuit (402) immediately behind the speaker as is shown in FIG. 4a and FIG. 4b.

As stated above, according to the first to fourth embodiments of the present invention, a digital input signal which is input to a digital speaker apparatus is not converted even once into an analog signal within the digital speaker apparatus, and by driving a plurality of speaker driving elements by a plurality of digital signals, it becomes possible to directly convert a digital signal into an analog audio. An A/D convertor circuit necessary for the analog conversion is not required because a digital signal is not converted to an analog signal in the apparatus, and a reduction of power consumption and of a required semiconductor area is possible and a low cost digital speaker apparatus can be provided. Because the digital speaker apparatus can output a large sound pressure with a low driving voltage, in the case where a digital signal process circuit is formed monolithically on a semiconductor, it is not necessary to use a special semiconductor technology for handling a high voltage, and it is possible to provide an integrated digital speaker driving apparatus necessary for a digital speaker apparatus using a low voltage semiconductor technology. Electromagnetic irradiation (EMI) is small because of driving with a low voltage and it is possible to reduce the costs of suppressing electromagnetic irradiation. Because there is no A/D (D/A) convertor between a digital signal source and digital speaker apparatus, it is possible to avoid a deterioration in sound quality.

Fifth Embodiment

Figure 5:
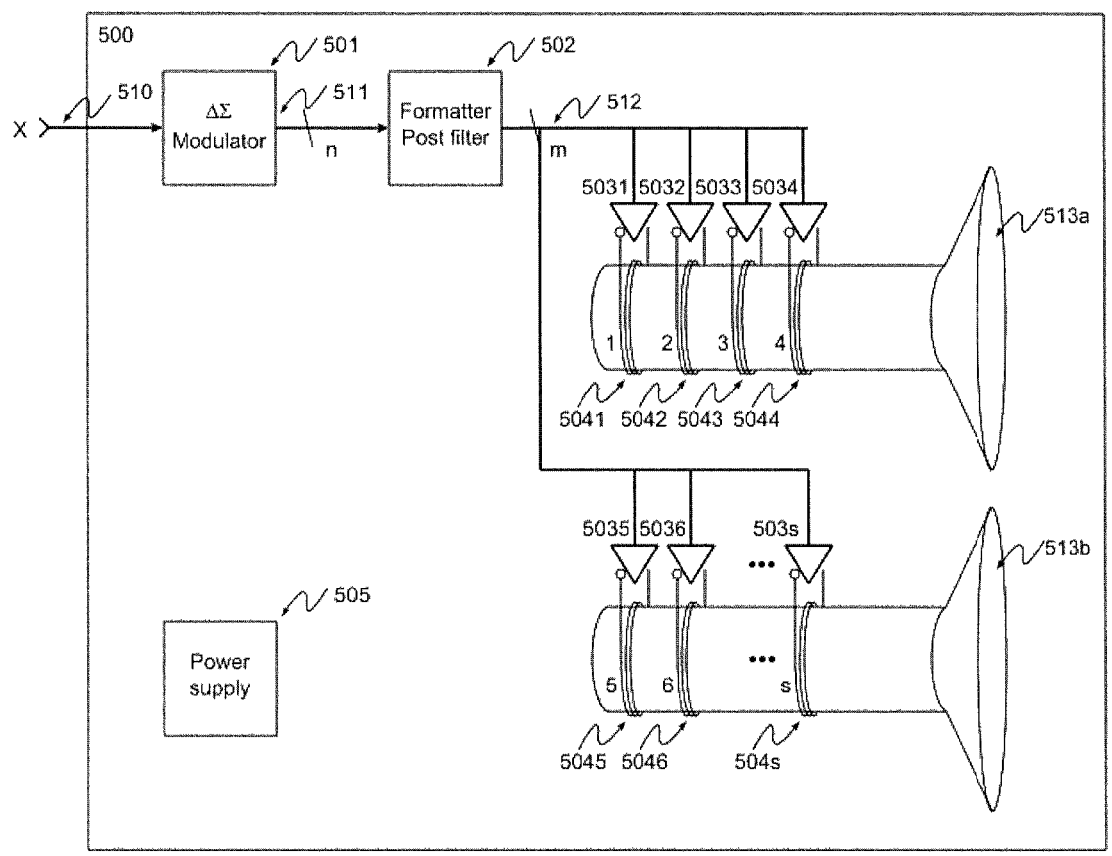
FIG. 5 is a structural diagram of a digital acoustic system related to a fifth embodiment of the present invention.

FIG. 5 shows a fifth embodiment of a digital speaker apparatus system including a circuit which outputs a plurality of digital signals by a ΔΣ modulator and a post filter circuit, and a plurality of speaker driving elements. A 1 bit digital input signal (510) is input to the ΔΣ modulator (501) and converted to a plurality of n bit digital signals (511) by the ΔΣ modulator (501). The plurality of n bit digital signals are converted to m number of digital signals (512) which have been miss-match shaped by a post filter (502). The m number of digital signals drive s number of driving elements (5041-504s) by speaker driving circuits (5031-503s) and an analog audio is directly converted by vibration membranes (513). The ΔΣ modulator (501), a post filter circuit (502), the speaker driving circuits (5031-503s), and a power circuit (505) which supplies a power to these circuits are structural components of the digital speaker apparatus (500). In the present embodiment, s number of driving elements which are combined drive a plurality (2) of speaker vibration membranes (513a, 513b). An arbitrary combination is possible between the number of driving elements (s) and the number of speaker vibration membranes (r), as long as a circuit outputting a plurality of digital signals by a ΔΣ modulator and a post filter directly coverts into an analog audio by driving a plurality of speaker elements. Generally, it is sufficient that s>1 and r≥1.

Sixth Embodiment

Figure 6:
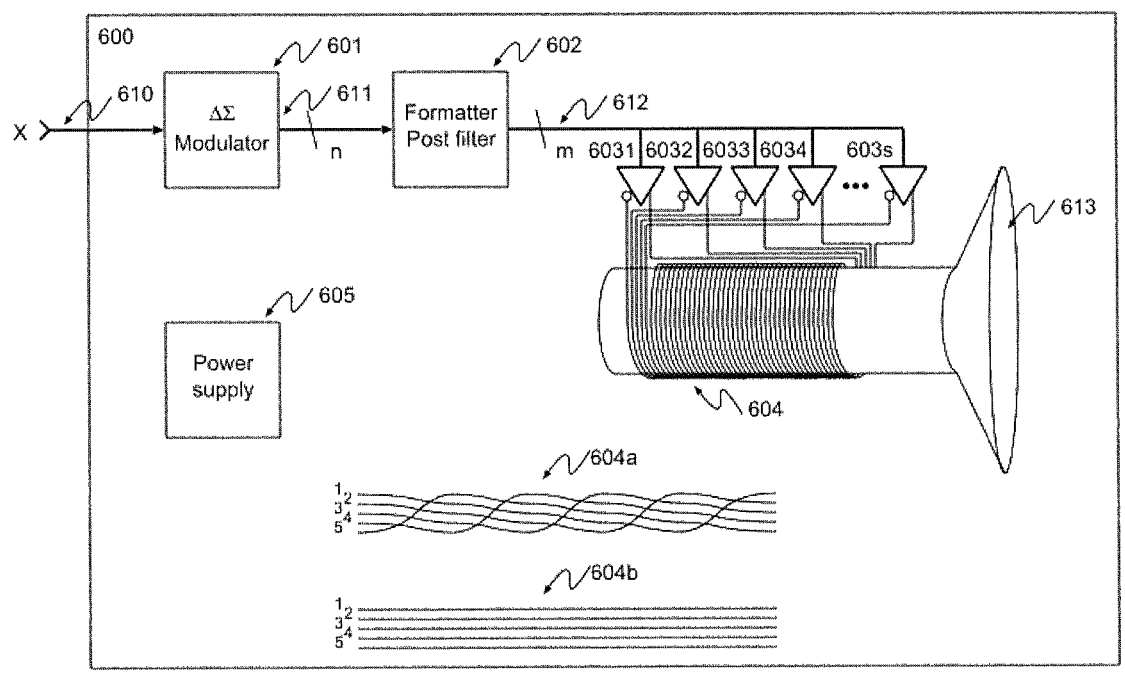
FIG. 6 is a structural diagram of a digital acoustic system related to a sixth embodiment of the present invention.

FIG. 6 shows a sixth embodiment of a digital speaker apparatus system including a circuit which outputs a plurality of digital signals by a ΔΣ modulator and a post filter circuit, and a plurality of speaker driving elements. A 1 bit digital input signal (610) is input to a ΔΣ modulator (601) and converted to a plurality of n bit digital signals (611) by the ΔΣ modulator (601). The plurality of n bit digital signals (611) are converted to m number of digital signals (612) which have been miss-match shaped by a post filter (602). The m number of digital signals drive s number of driving elements (6041-604s) by speaker driving circuits (6031-603s) and a vibration membrane (613) directly converts into analog audio. The ΔΣ modulator (601), the post filter circuit (602), speaker driving circuits (6031-603s) and the power circuit (605) which supplies a power to these circuits are structural components of the digital speaker apparatus (600).

In the present embodiment, a plurality of coils are bunched together and wound so that s number of driving elements together drive speaker vibration membrane (613). In the case of winding a plurality of coils, a plurality of coil wires may be twisted (604a) and wound or they may be lined up (604b) and wound. In addition, a single part of a coil may also be separated. An arbitrary arrangement of the plurality of driving elements required for the digital speaker apparatus is possible.

Seventh Embodiment

Figure 7:
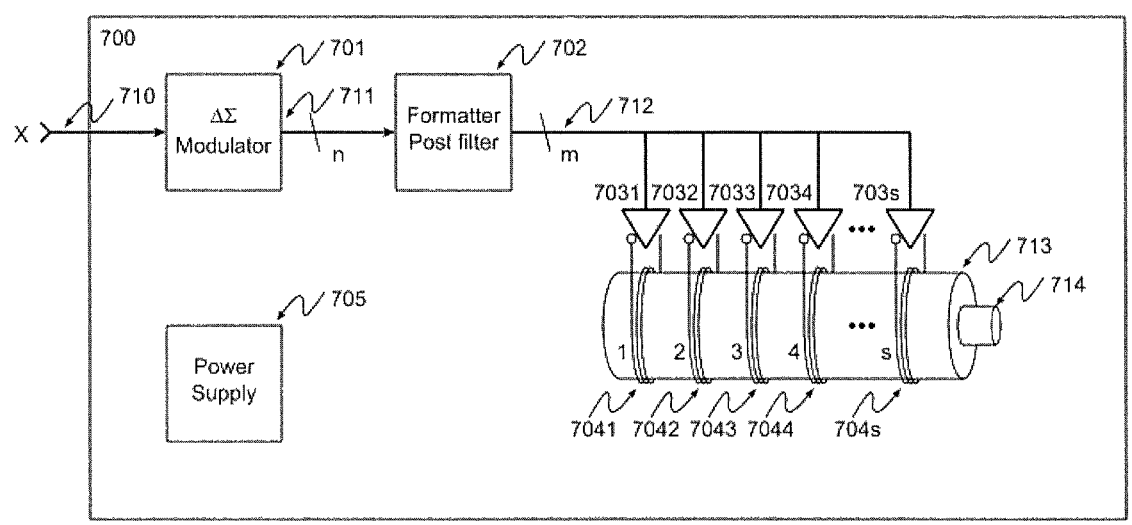
FIG. 7 is a structural diagram of a digital acoustic system related to a seventh embodiment of the present invention.

FIG. 7 shows a seventh embodiment of a digital speaker apparatus system including a circuit which outputs a plurality of digital signals by a ΔΣ modulator and a post filter circuit, and a plurality of speaker driving elements. A 1 bit digital input signal (710) is input to a ΔΣ modulator (701) and converted to a plurality of n bit digital signals (711) by the ΔΣ modulator (701). The plurality of n bit signals are converted to m number of digital signals (712) which have been miss-match shaped by a post filter (702). The m number of digital signals drive s number of driving coils (7041-704s) by driving circuits (7031-703s) and generate a magnetic field to a magnetostrictor (713). An audio signal is directly converted by a driving part (714) which is mechanically connected with the magnetostrictor (713). The ΔΣ modulator (701), the post filter circuit (702), the speaker driving circuits (7031-703s) and a power circuit (705) which supplies a power to these circuits are structural components of the digital speaker apparatus (700).

In the present embodiment, a plurality of coils are wound so that s number of driving elements drive the driving part (714) which is mechanically connected with the magnetostrictor (713). The size of the magnetostrictor (713) changes at a speed of nsec–μsec according to an external magnetic field caused by a coil or a magnet. It is possible to realize a bone conduction digital speaker apparatus (700) if a magnetostrictor (713) is used instead of an ordinary voice coil. Other than the bone conduction digital speaker apparatus (700) the present embodiment can also be applied to the digital control of an injection valve, a pump, a positioner, an actuator such as a linear actuator, and a sensor such as a torque sensor among vehicle parts.

Eighth Embodiment

Figure 8A:
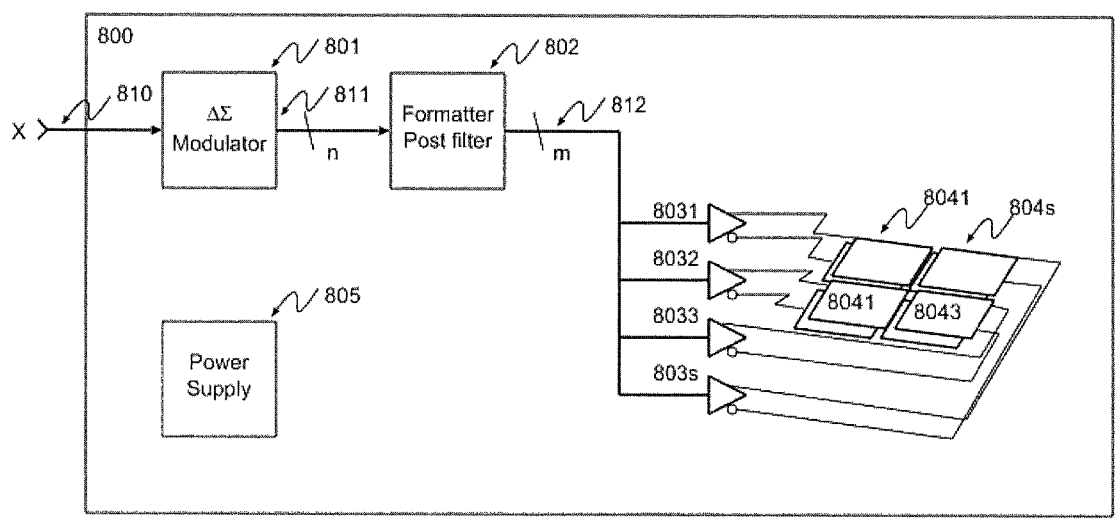
FIG. 8a is a structural diagram of a digital acoustic system related to an eighth embodiment of the present invention.
Figure 8B:
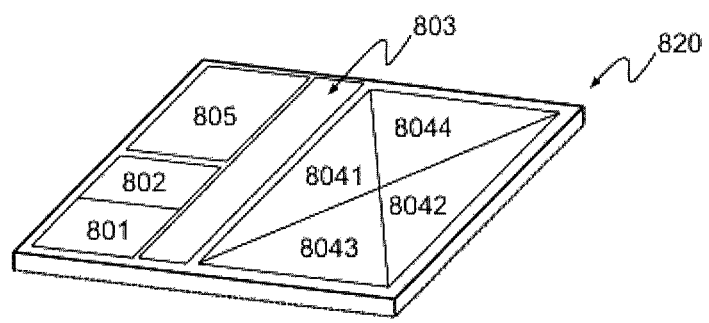
FIG. 8b is a structural diagram of a digital acoustic system related to an eighth embodiment of the present invention.
Figure 8C:
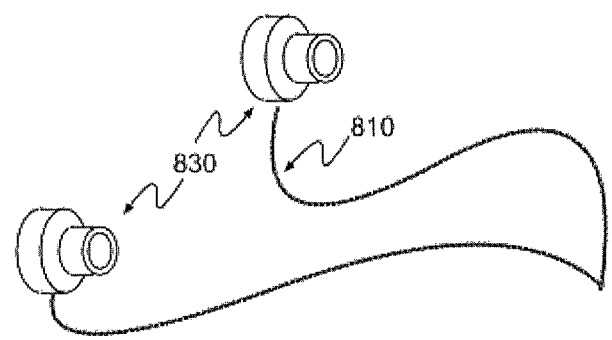
FIG. 8c is a structural diagram of a digital acoustic system related to an eighth embodiment of the present invention.

An eighth embodiment of a digital speaker apparatus system including a circuit which outputs a plurality of digital signals by a ΔΣ modulator and a post filter circuit, and a plurality of speaker driver elements is shown in FIG. 8 *a* to FIG. 8c. A 1 bit digital input signal (810) is input to a ΔΣ modulator (801) and converted to a plurality of n bit digital signals (811) by the ΔΣ modulator (801). The plurality of n bit signals are converted to m number of digital signals (812) which have been miss-match shaped by a post filter (802). The m number of digital signals drive s number of electrostatic elements (8041-804s) by driving circuits (8031-803s) and an audio signal is obtained. The ΔΣ modulator (801), post filter circuit (802), speaker drive circuits (8031-803s), and a power circuit (805) which supplies a power to these circuits are structural components of the digital speaker apparatus (800).

FIG. 8b shows an embodiment wherein the ΔΣ modulator (801), a post filter circuit (802), and four electrostatic elements (8041-8044) are formed monolithically on the same substrate. This type of integrated digital speaker apparatus (820) can be realized by manufacturing a digital circuit and an electrostatic speaker element on the same silicon substrate using a silicon process technology, for example, and the integration into a headphone apparatus (830) which uses the type of digital speaker apparatus shown in FIG. 8c is easy.

Ninth Embodiment

Figure 9A:
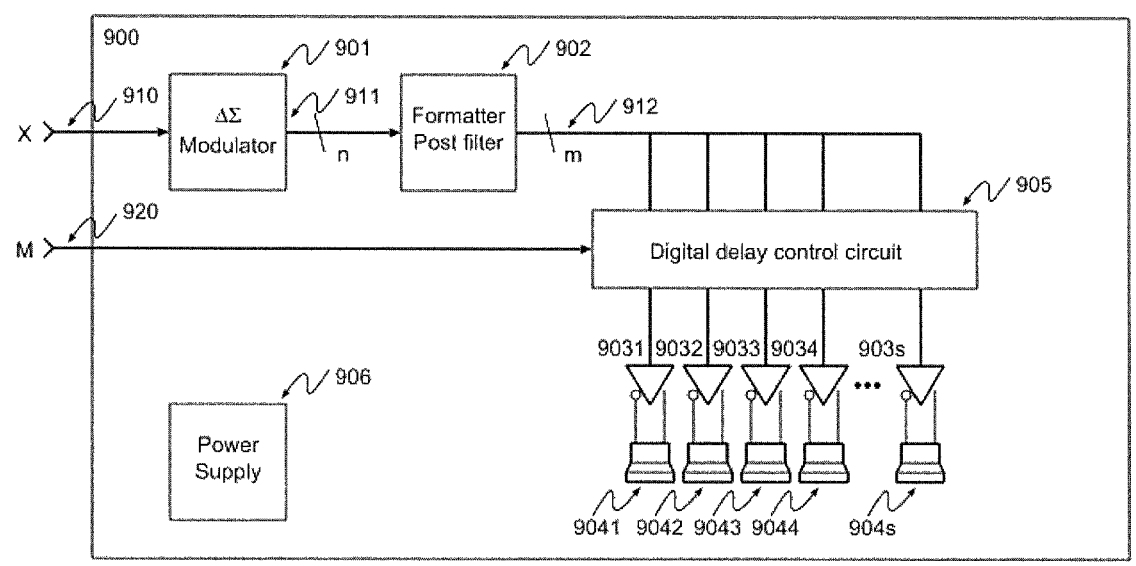
FIG. 9a is a structural diagram of a digital acoustic system related to a ninth embodiment of the present invention.

FIG. 9a shows a ninth embodiment of a digital speaker apparatus system including a circuit which outputs a plurality of digital signals by a ΔΣ modulator and a post filter circuit, and a plurality of speaker driving elements. A 1 bit digital input signal (910) is input to a ΔΣ modulator (901) and converted to a plurality of n bit digital signals (911) by the ΔΣ modulator (901). The plurality of n bit signals are converted to m number of digital signals (912) which have been miss-match shaped by a post filter (902). The m number of digital signals drive s number of speakers (9041-904s) by driving circuits (9031-903s) after a delay is individually controlled by a digital delay control circuit (905) controlled by a digital signal (920), and an audio signal is obtained. The ΔΣ modulator (901), the post filter circuit (902), the speaker drive circuits (9031-903s), and a power circuit (905) which supplies a power to these circuits is a structural component of the digital speaker apparatus (900).

Figure 9B:
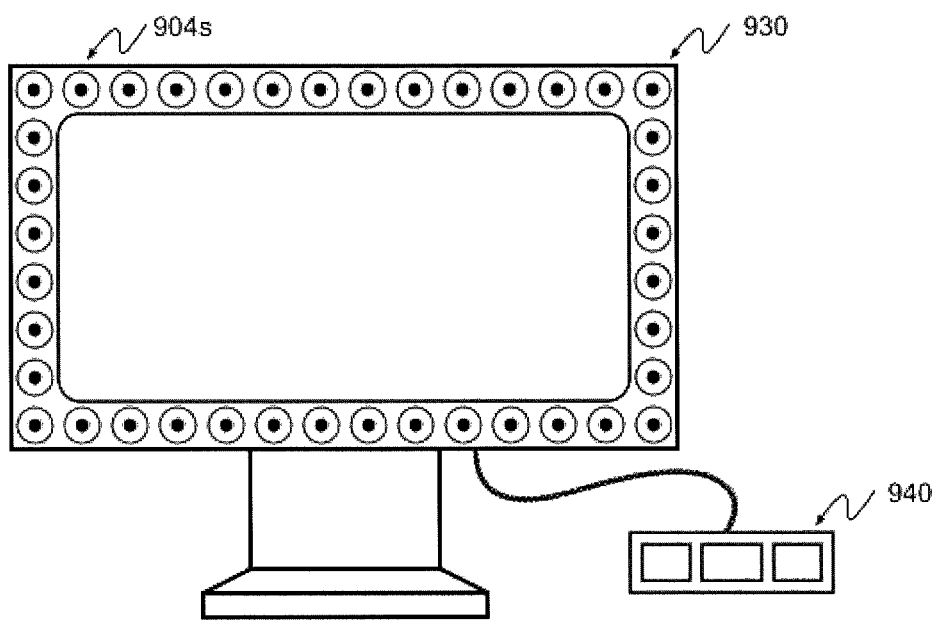
FIG. 9b is a structural diagram of a digital acoustic system related to a ninth embodiment of the present invention.

FIG. 9b shows an embodiment of the digital speaker apparatus (900) in the case where the ΔΣ modulator (901), a post filter circuit (902), speaker driving circuits (9031-903s), and the power source circuit (906) which supplies a power to these circuits are connected to a large screen flat display television (930). A plurality of speakers are arranged on the top side, the bottom side, the left side, and the right side of the flat television and it is possible to change the directionality of a play back sound by controlling the delay of signals which drive each of the speakers. For example, if the delay times of digital signals to a plurality of speakers of the digital speaker apparatus (900) are controlled by a signal from a home game console (940), it is possible to increase the realistic sensation of the game by directing the audio to the top, the bottom, the left, or the right according to the contents of the game.

Similarly, if the delay times of digital signals to the plurality of speakers of the digital speaker apparatus (900) are controlled by a signal from a remote control of the flat screen television, the directionality of the play back sound can be focused in the central part of the screen, or the play back sound may be made to have no directionality so that play back sound can be heard throughout a room according to the contents of the program being watched.

It is possible to manufacture a digital acoustic system with a digital speaker apparatus, as shown in the first to the ninth embodiments, by inputting a signal of a digital signal source as a digital signal to a digital speaker apparatus including a circuit which outputs a plurality of digital signals by a ΔΣ modulator and a post filter circuit, and a plurality of speaker driving elements and a plurality of speakers.

Tenth Embodiment

Figure 10:
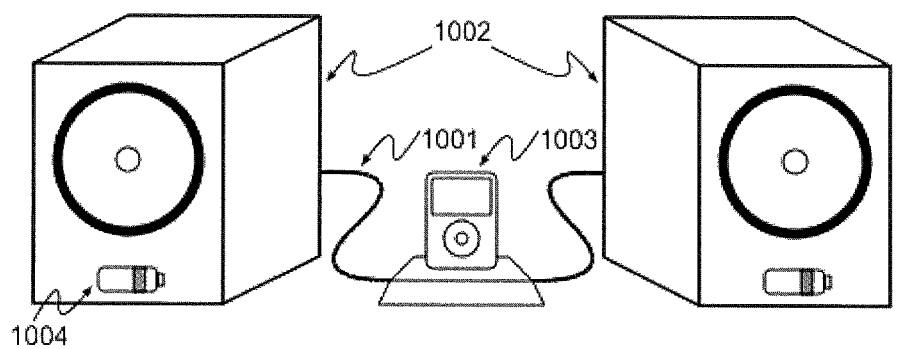
FIG. 10 is a structural diagram of a digital acoustic system related to a tenth embodiment of the present invention.

FIG. 10 shows a tenth embodiment of a digital acoustic system with a digital speaker apparatus (1002) including a circuit which outputs a plurality of digital signals by a ΔΣ modulator and a post filter circuit, a plurality of speaker driver elements, and a plurality of speakers, to which a digital signal from a mobile digital sound source play back apparatus as a digital signal source (1003) is connected (1001) and which directly converts to an analog audio without converting an input digital signal to an analog signal. In the present embodiment, a battery (1004) is used as a power source supplied to the digital speaker apparatus. However, it is possible to supply power from a separate external power source.

Eleventh Embodiment

Figure 11:
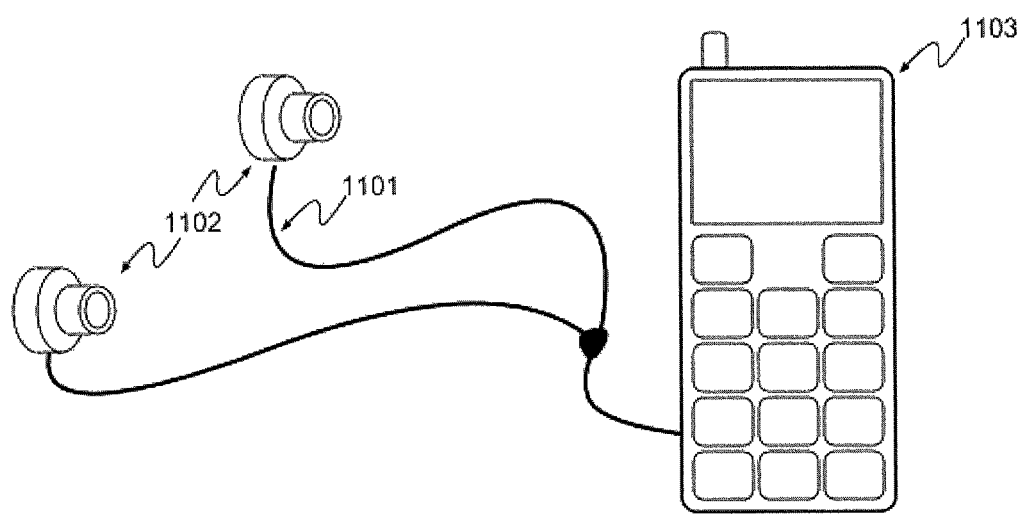
FIG. 11 is a structural diagram of a digital acoustic system related to an eleventh embodiment of the present invention.

FIG. 11 shows an eleventh embodiment of a digital acoustic system with a digital speaker apparatus (1102) including a circuit which outputs a plurality of digital signals by a ΔΣ modulator and a post filter circuit, a plurality of speaker driving elements and a plurality of speakers, to which a digital signal from a mobile phone device as a digital signal source (1103) is connected (1101) and which directly converts to an analog audio without converting an input digital signal to an analog signal. A headphone type digital speaker apparatus is used as the digital speaker apparatus in the present embodiment. However, it is possible to use an arbitrary digital speaker apparatus other than headphones.

Twelfth Embodiment

Figure 12:
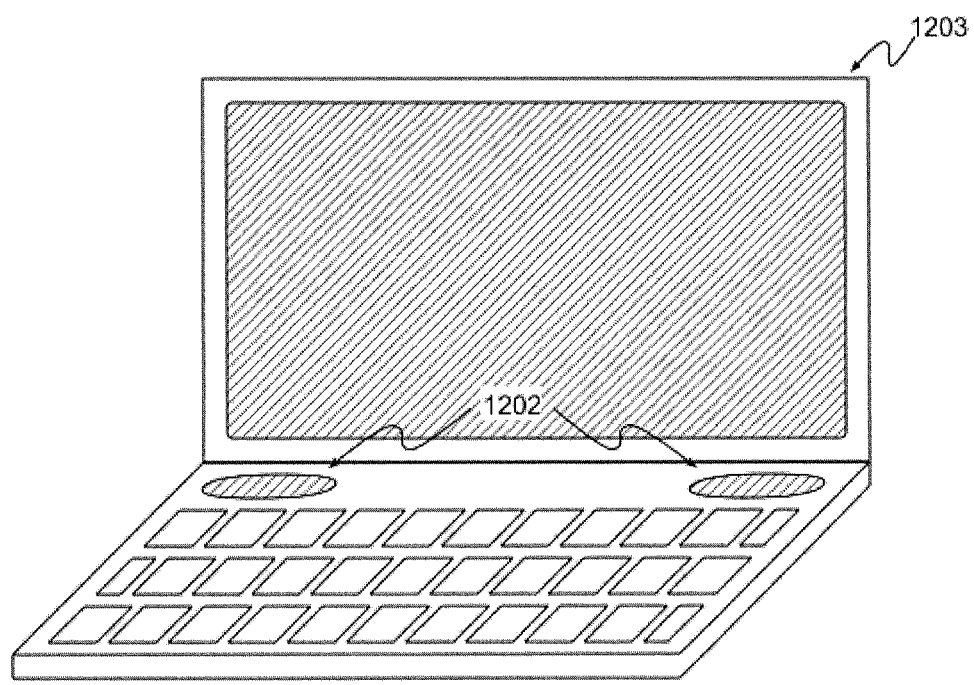
FIG. 12 is a structural diagram of a digital acoustic system related to a twelfth embodiment of the present invention.

FIG. 12 shows a twelfth embodiment of a digital acoustic system with a digital speaker apparatus (1202) including a circuit which outputs a plurality of digital signals by a ΔΣ modulator and a post filter circuit, a plurality of speaker driving elements, and a plurality of speakers, to which a digital signal from a personal computer as a digital signal source (1203) is connected and, which directly converts to an analog audio without converting an input digital signal to an analog signal. A digital speaker apparatus arranged with a plurality of coils on one vibration membrane is used in the present embodiment. However, it is possible to use a digital speaker apparatus arranged with a plurality of speakers.

Thirteenth Embodiment

Figure 13:
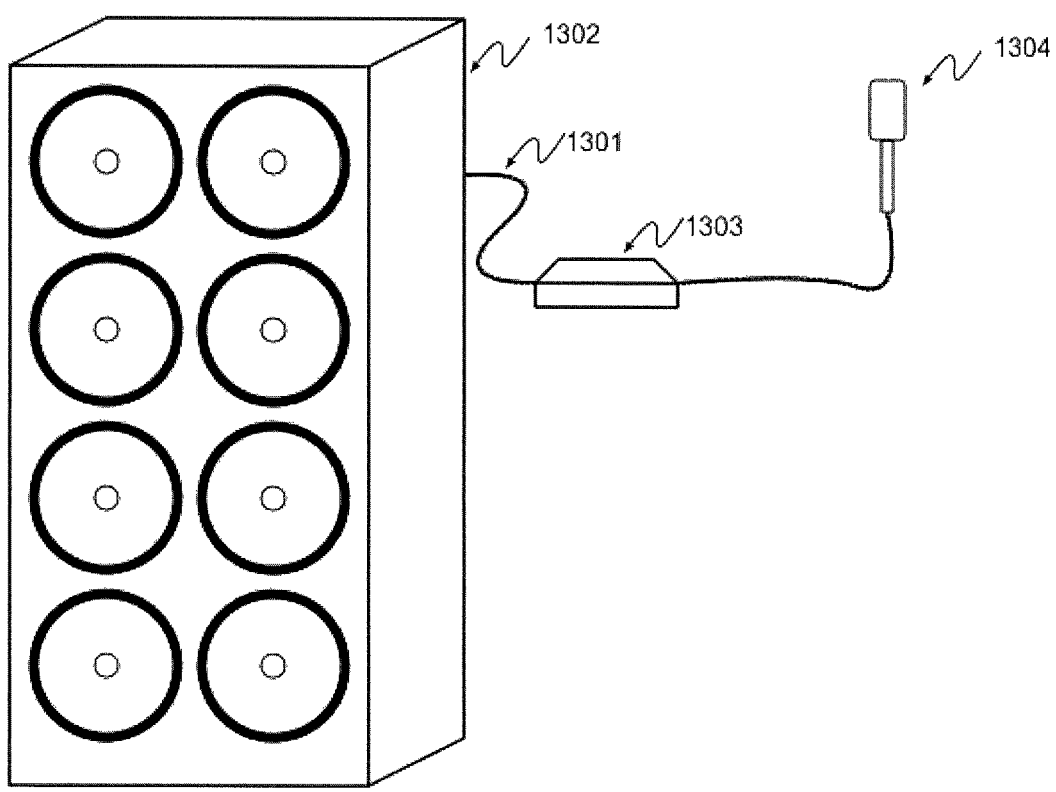
FIG. 13 is a structural diagram of a digital acoustic system related to a thirteenth embodiment of the present invention.

FIG. 13 shows a thirteenth embodiment of a digital acoustic system with a digital speaker apparatus (1302) including a circuit which outputs a plurality of digital signals by a ΔΣ modulator and a post filter circuit, a plurality of speaker driving elements and a plurality of speakers, to which a digital signal from an active noise control digital audio processing apparatus as a digital signal source (1303) is connected and which directly converts to an analog audio without converting an input digital signal to an analog signal. A signal which cancels peripheral noise from a sound collecting microphone (1304) is calculated by a digital audio processing apparatus, and by inputting to the digital speaker apparatus (1302) it is possible to manufacture a low power consumption active noise control digital acoustic system. It is also possible to apply the present embodiment to a television phone or a remote conference echo cancelling digital acoustic system. It is also possible to apply the present embodiment to a digital acoustic system for a delay control of a large scale amplifier in a concert hall or a sports ground.

Fourteenth Embodiment

Figure 14:
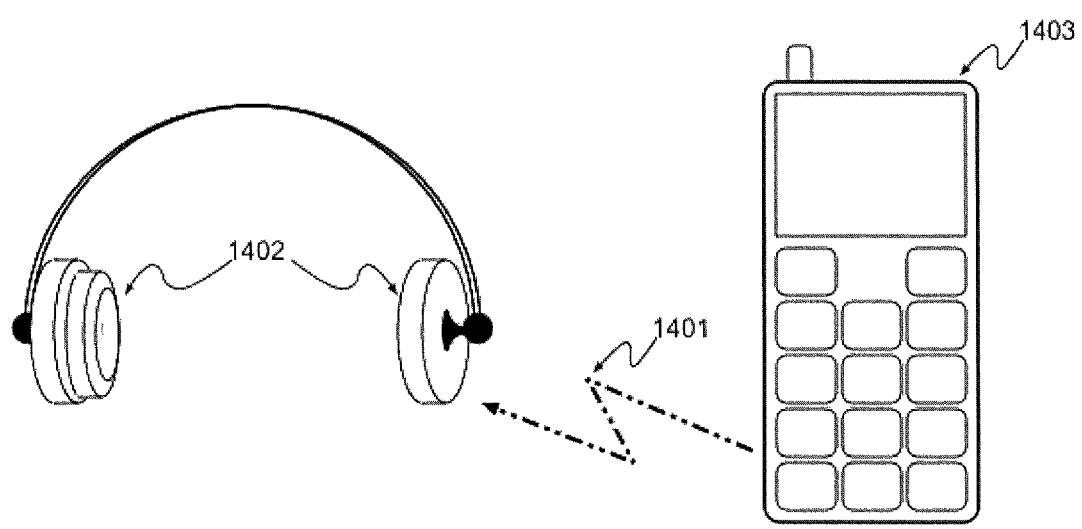
FIG. 14 is a structural diagram of a digital acoustic system related to a fourteenth embodiment of the present invention.

FIG. 14 shows a fourteenth embodiment of a digital acoustic system with a digital speaker apparatus (1402) including a circuit which outputs a plurality of digital signals by a ΔΣ modulator and a post filter circuit, a plurality of speaker driving elements and a plurality of speakers, to which a digital signal from a mobile phone device via a wireless communication technology (Bluetooth etc) as a digital signal source (1403) is connected (1401) and which directly converts to an analog audio without converting an input digital signal to an analog signal. A headphone type digital speaker apparatus is used as the digital speaker apparatus in the present embodiment. However, it is possible to use an arbitrary digital speaker apparatus other than headphones. In addition, in the present embodiment, an example using a mobile phone device as the digital signal source (1403) is shown. However, the present embodiment can also be applied to an arbitrary digital acoustic system which connects a digital signal to the digital speaker apparatus (1402) from a digital signal source via a wireless communication technology.

Fifteenth Embodiment

Figure 15A:
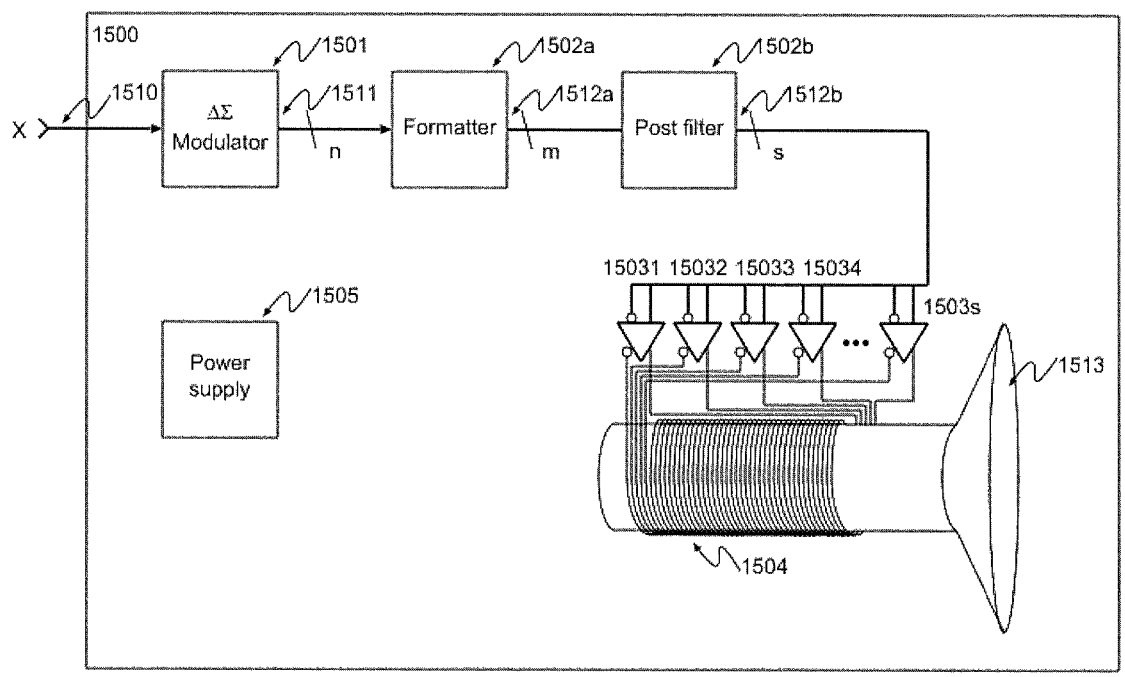
FIG. 15a is a structural diagram of a digital acoustic system related to a fifteenth embodiment of the present invention.

FIG. 15a shows a fifteenth embodiment of a system configuration of a digital speaker apparatus including a circuit which outputs a plurality of digital signals by a ΔΣ modulator and a post filter circuit, and a plurality of speaker driver elements. A 1 bit digital input signal (1510) is input to a ΔΣ modulator (1501) and converted to a plurality of n bit digital signals (1511) by the ΔΣ modulator (1051). The plurality of n bit signals are converted to m number of digital signals (1512a) by a formatter (1502a) and converted to m number of digital signals (1512b) which have been miss-match shaped by a filter (1502b). The m number of digital signals drive s number of driving elements (15041-1504s) by speaker driving circuits (15031-1503s) and an analog signal is directly converted by a vibration membrane (1513). The ΔΣ modulator (1501), the formatter (1502a), the filter (1502b), speaker drive circuits (15031-1503s) and a power circuit (1505) which supplies a power to these circuits are structural components of the digital speaker apparatus (1500).

Figure 15B:
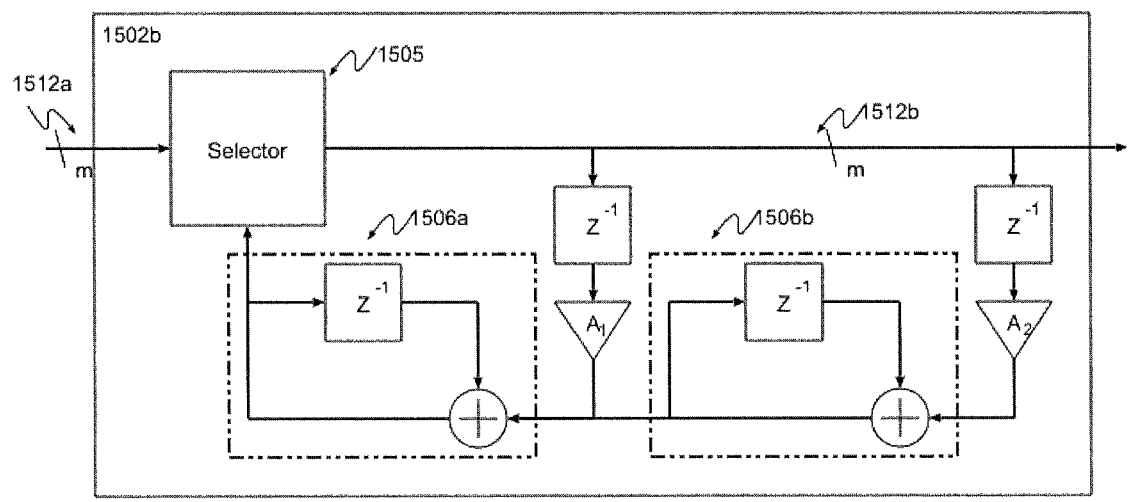
FIG. 15b is a structural diagram of a digital acoustic system related to a fifteenth embodiment of the present invention.

The structural components of a filter circuit (1502b) used in the present embodiment are shown in FIG. 15b. In order to perform miss-match shaping, the m number of digital signals (1512a), which are input to a selection circuit (1505), are selected in order of low usage frequency by calculating the usage frequency of the m number of digital signals of the selection circuit using an integration circuit (1506a) and an integration circuit (1506b), which are formed by delay elements and adders.

Sixteenth Embodiment

Figure 16:
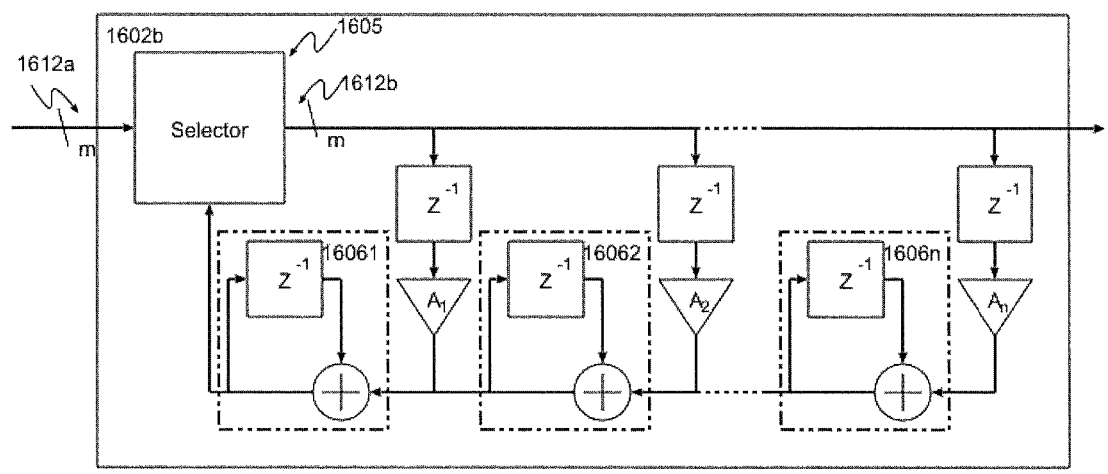
FIG. 16 is a structural diagram of a digital acoustic system related to a sixteenth embodiment of the present invention.

FIG. 16 shows a sixteenth embodiment of a system configuration of a digital speaker apparatus including a circuit which outputs a plurality of digital signals by a ΔΣ modulator and a post filter circuit, and a plurality of speaker driving elements. The structural components of the filter circuit (1602b) used in the present embodiment are shown. In order to perform miss-match shaping, the m number of digital signals (1612a), which are input to a selection circuit (1605), are selected in order of low usage frequency by calculating the usage frequency of the m number of digital signals of the selection circuit using n stages of integration circuits (16061-1606n), which are formed by delay elements and adders. In the present embodiment, the filter circuit can be formed by an arbitrary number of stages of integration circuits of one stage or more.

Seventeenth Embodiment

Figure 17A:
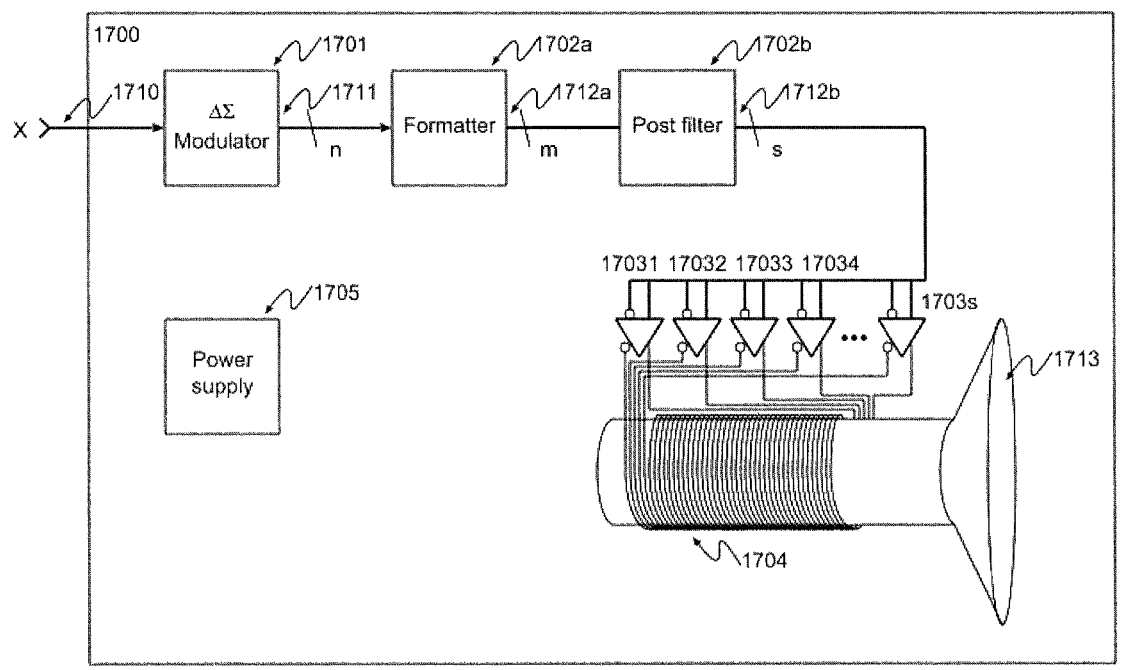
FIG. 17a is a structural diagram of a digital acoustic system related to a seventeenth embodiment of the present invention.

FIG. 17a shows a seventeenth embodiment of a system configuration of a digital speaker apparatus including a circuit which outputs a plurality of digital signals by a ΔΣ modulator and a post filter circuit, and a plurality of speaker driving elements having 3-valued switching amplifiers. A 1 bit digital input signal (1710) is input to a ΔΣ modulator (1701). The ΔΣ modulator (1701) converts the digital input signal to a plurality of n bit digital signals (1711). The plurality of n bit signals are converted to m number of digital signals (1712a) by a formatter (1702a) and converted to m number of digital signals (1712b) which have been miss-match shaped by a filter (1702b). The speaker driving circuits (17031-1703s) directly generate an analog audio by a vibration membrane (1713) by driving s number of driving elements (17041-1704s) to each of which a part of the m number of digital signals are input. Furthermore, the driving elements (17041-1704s) are formed from s number of 3-valued switching amplifiers. The ΔΣ modulator (1701), the formatter (1702a), the filter (1702b), the speaker drive circuits (17031-1703s) which are formed from 3-valued switching amplifiers, and a power circuit (1705) which supplies a power to these circuits are structural components of the digital speaker apparatus (1700).

For example, in the case where s=8, let us suppose that a digital speaker apparatus is formed by 8 speaker driving circuits each having a 3-valued switching amplifier. Each driving device can hold a 3-valued state among −1, 0, and +1. Therefore, because the speaker device circuit including 8 3-valued switching amplifiers can hold −8, −7, . . . −1, 0, +1, . . . +7, +8 (=17) states, the number of bits of a digital signal (1712a) output by the formatter (1702a) becomes m=17. Similarly, because the number of bits required to express m=17 states in binary is 5 bits, it is sufficient to prepare a ΔΣ modulator (1701) which converts a 1 bit digital input signal (1710) into an n=5 bit digital signal (1711).

Figure 17B:
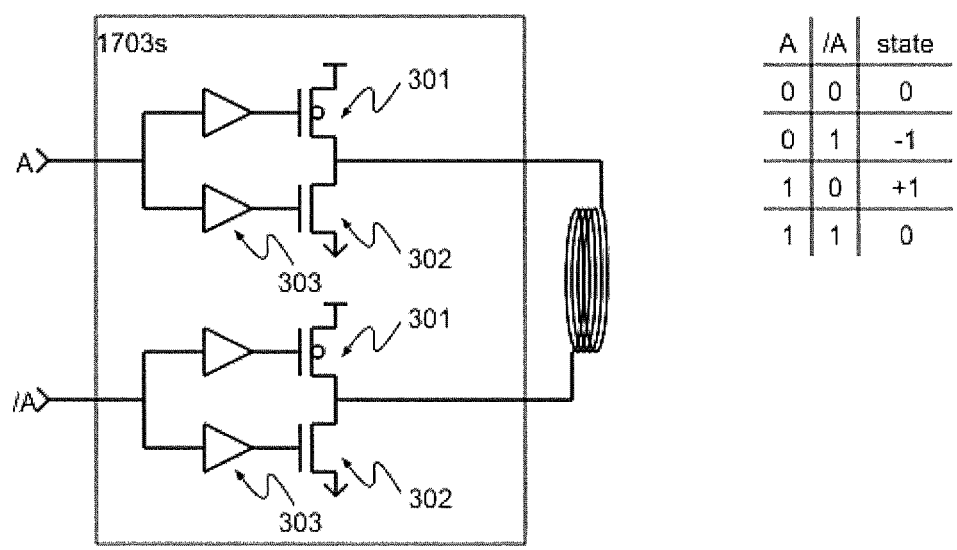
FIG. 17b is a structural diagram of a speaker driving circuit including a 3 level switching amplifier related to one embodiment

FIG. 17b shows an embodiment of a speaker driving circuit including a 3-valued switching amplifier. In FIG. 17b, a circuit of a speaker driving circuit 1703s is shown as an example among circuits from 17031 to 1703s. The speaker driving circuit 1703s includes a first and a second source transistor 301 and a first and a second sink transistor. The first source transistor and the first sink transistor are connected in series and an input signal A is input to each gate. In addition, the second source transistor and the second sink transistor are connected in series and an input signal /A is input to each gate. In addition, each of the connection points of the first source transistor and the first sink transistor, and the connection points of the second source transistor and the second sink transistor are connected to a digital signal terminal, two of which form a pair, of a digital speaker. Furthermore, this type of circuit is generally called an H bridge circuit in the field of motor control.

As is shown in the chart of FIG. 17b, the speaker driving circuit (1703s) holds 3-valued states (−1, 0, +1) according to the state of input signals /A and A. Furthermore, generally, /A expresses the inverse of A, however, in the present embodiment, /A and A sometimes have the same value.

In the digital speaker apparatus system including a circuit which outputs a plurality of digital signals by a ΔΣ modulator and a post filter circuit, and a plurality of speaker driving elements having 3-valued switching amplifiers, as shown in FIG. 17a and FIG. 17b, the speaker driving circuit (1700b) can be configured so that the number of 0 states increases when the amplitude of a digital signal which is input is small, wasteful switching operations can be avoided, and a low power consumption digital speaker apparatus can be realized. Simultaneously, noise and electromagnetic radiation caused by a switching operation can be reduced.

Eighteenth Embodiment

Figure 18:
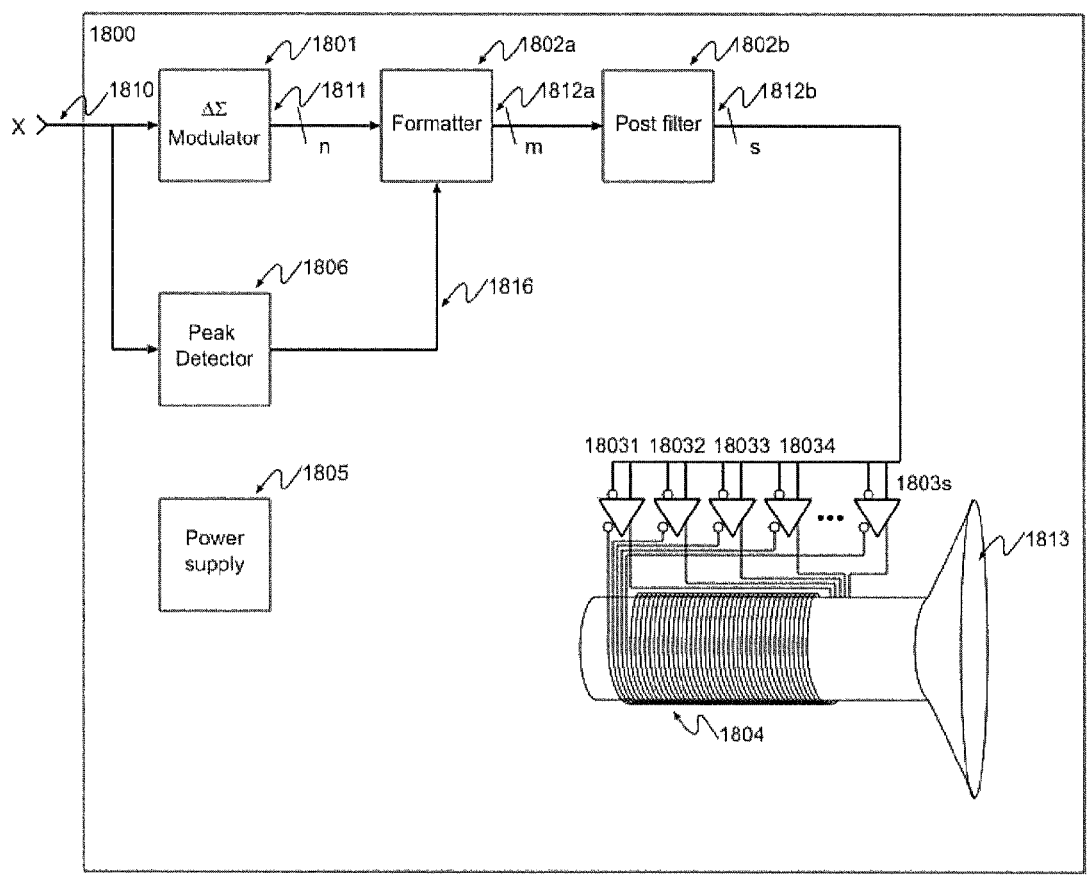
FIG. 18 is a structural diagram of a digital acoustic system related to an eighteenth embodiment of the present invention.

FIG. 18 shows an eighteenth embodiment of a system configuration of a digital speaker apparatus including a circuit which outputs a plurality of digital signals by a ΔΣ modulator and a post filter circuit, and a plurality of speaker driving elements having 3-valued switching amplifiers. A 1 bit digital input signal (1810) is input to the ΔΣ modulator (1801) and the ΔΣ modulator (1801) converts the digital input signal to a plurality of n bit digital signals (1811). The plurality of n bit signals are converted to m number of digital signals (1812a) by a formatter (1802a) and converted to m number of digital signals (1812b) which have been miss-match shaped by a filter (1802b). The speaker driving circuits (18031-1803s) drive s number of drive elements (18041-1804s) to each of which a part of the m number of digital signals is input, and an analog audio is directly generated by a vibration membrane (1813). Furthermore, the driving elements (18041-1804s) are formed from s number of 3-valued switching amplifiers.

A 1 bit digital input signal (1810) is also input to a peak detector (1806) and a control signal (1816) is output according to the amplitude value of the digital input signal. The peak detector (1806) calculates the amplitude value of audio which the digital input signal represents and the control signal (1816) is output according to the result of this calculation. For example, the amplitude value is calculated as the loudness of audio during a certain length. The control signal (1816) is input to the formatter (1802a). The formatter (1802a) controls change of the number of bits of the digital signal (1812a) which is input to the filter (1802b) up to the maximum m bits according to the amplitude value. That is, if the amplitude value is 0 or small, the digital signal (1812a) with 0 bits or a number of bits close to 0 is output by the formatter, and if the amplitude value is large, the digital signal (1812a) with a number of bits close to m is output by the formatter. Furthermore, for example, the number of bits of the digital signal (1812a) is calculated except a signal which keeps the same value during a certain time period.

The ΔΣ modulator (1801), the formatter (1802a), the filter (1802b), the speaker drive circuits (18031-1803s) which are formed from a three level switching amplifier, the peak detector (1806) and their circuits are a structural component of the digital speaker apparatus (1800).

As stated above, a system of dynamically controlling the number of bits of a digital signal which is input to a filter according to the amplitude of the digital signal which is input, the system including a digital speaker apparatus having a circuit which outputs a plurality of digital signals by a ΔΣ modulator and a post filter circuit, and a plurality of speaker driving elements having 3-valued switching amplifiers and also including a peak detector is explained with reference to FIG. 18. In this type of system, because the number of units for miss-match shaping in the filter which operates is small when the amplitude of a digital signal which is input is small, the range of characteristic variations of the units becomes smaller. Consequently, because it is possible to effectively control noise, it is possible to realize a digital speaker apparatus which can play back high quality audio. Simultaneously, noise and electromagnetic radiation caused by a switching operation can be reduced.

Nineteenth Embodiment

Figure 19:
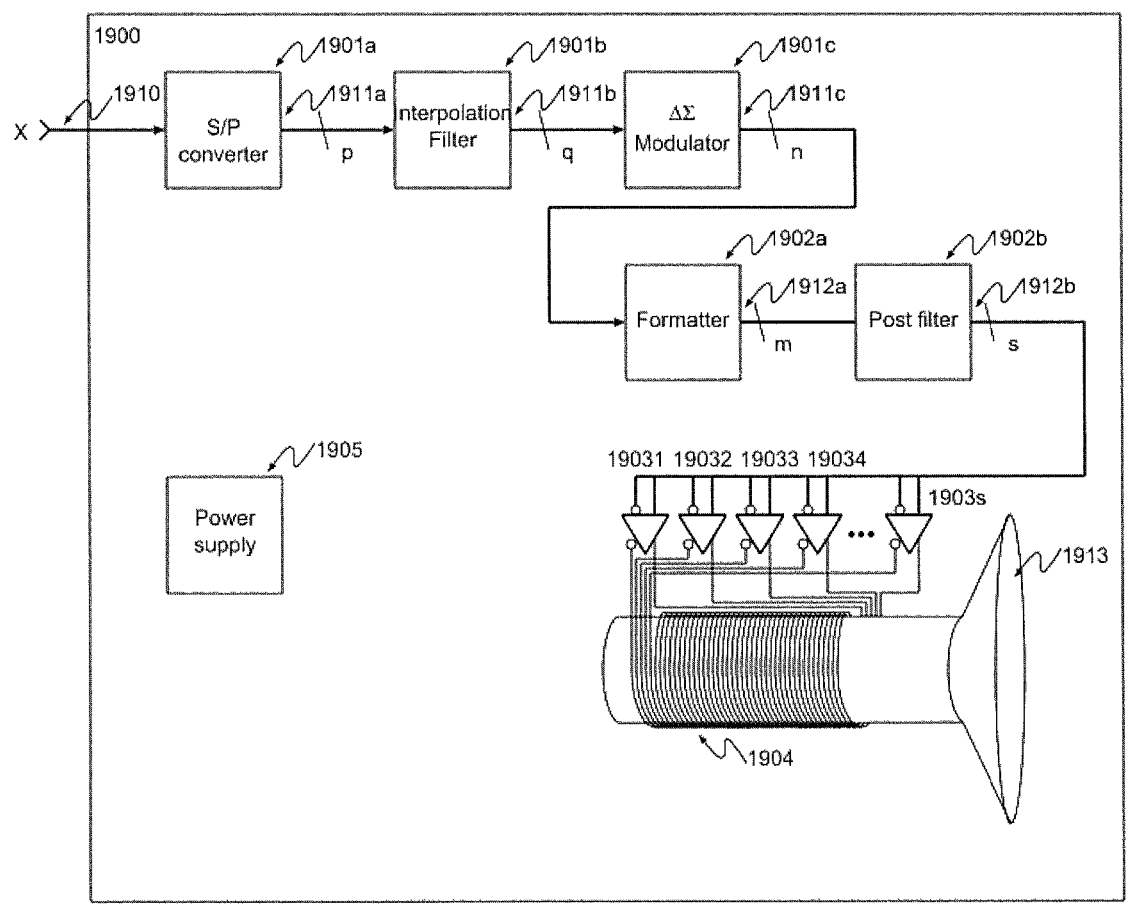
FIG. 19 is a structural diagram of a digital acoustic system related to a nineteenth embodiment of the present invention.

FIG. 19 shows a nineteenth embodiment of a system configuration of a digital speaker apparatus including a circuit which outputs a plurality of digital signals by a ΔΣ modulator and a post filter circuit, and a plurality of speaker driving elements having 3-valued switching amplifiers. A 1 bit digital input signal (1910) is input to a serial parallel convertor (1901a) and the serial parallel convertor (1901a) converts the digital input signal to a p bit digital audio signal (1911a). For example, in the case where the 1 bit digital input signal (1910) is obtained by play back of audio data recorded in a compact disc (CD), conversion to a 16 bit digital audio signal is preferred. In order to remove an unnecessary outside band of folding frequency component when the p bit digital audio signal (1911*a*) is over sampled by the ΔΣ modulator (1901*c*), the p bit digital audio signal (1911*a*) is input to an interpolation filter (1901*b*) and a q bit digital audio signal (1911*b*) is output. The q bit digital audio signal (1911*b*) is over sampled by the ΔΣ modulator (1901*c*) and converted to a plurality of n bit digital signals (1911*c*) by the ΔΣ modulator (1901*c*). In the present embodiment, the relationship of n<p and q and n>2 holds. The plurality of n bit digital signals are converted to m number of digital signals (1912*a*) by the formatter (1902*a*). The m number of digital signals (1912*a*) are input to the formatter (1902*a*) and converted to m number of digital signals (1912*b*) which have been miss-match shaped. The speaker driving circuits (19031-1903*s*) drive s number of drive elements (19041-1904*s*) to each of which a part of m number of digital signals are input, and an analog audio is directly converted by a vibration membrane (1913). Furthermore, the driving elements (19041-1904*s*) are formed from s number of 3-valued switching amplifiers. The ΔΣ modulator (1901), the formatter (1902*a*), the filter (1902*b*), the speaker drive circuits (19031-1903*s*) which are formed from 3-valued switching amplifiers, and a power circuit (1905) which supplies a power to these circuits are structural components of the digital speaker apparatus (1900).

As is shown in the nineteenth embodiment, a 1 bit digital signal input within the ΔΣ modulator (1901*c*) shown in the first to the eighteenth embodiments is converted to a p bit digital audio signal (1911*a*) by the serial parallel convertor (1901*a*). In addition, there may be a case in which the interpolation filter (1901*b*) is inserted in order to remove an unnecessary outside band of folding frequency component when the p bit digital audio signal is over sampled. These structural components are not essential components of the present invention. In the first to eighteenth embodiments, a 1 bit signal is input to a ΔΣ modulator. However, actually, it is possible to represent a digital audio signal having an arbitrary number of bits by the 1 bit digital signal. For example, the standard 16 bits in the case of a CD, and the standard 24 bits as well as 16 bits in case of a DVD are established.

It is possible to input a digital signal which can represent a digital audio signal having an arbitrary number of bits to a ΔΣ modulator, which is a structural component of the present invention. At this time, it is one of characteristics of the present invention that the number of bits of a digital signal which is output from the ΔΣ modulator is less than the number of bits of a digital audio signal which is input to the ΔΣ modulator. Consequently, it is possible to decode an audio signal by less speaker drive circuits than an amplitude gradient of audio which is represented by the number of bits of a digital signal.

For example, in the case where a 16 bit audio signal is to be faithfully played back, it is possible to play back an audio in the same or higher quality than the conventional technology with about 8 units in the present embodiment whereas in the conventional technology, $2^{16}-1=65535$ units are necessary.

As stated above, according to the present invention, because it is possible to decode an audio signal by directly driving less speaker driving circuits than the amplitude gradient of audio by a digital audio signal, it is possible to significantly reduce the costs required for a digital audio demodulation. It becomes easy to provide directionality acoustic effects using a plurality of speaker drive circuits simultaneously.

Twentieth Embodiment

Figure 20:
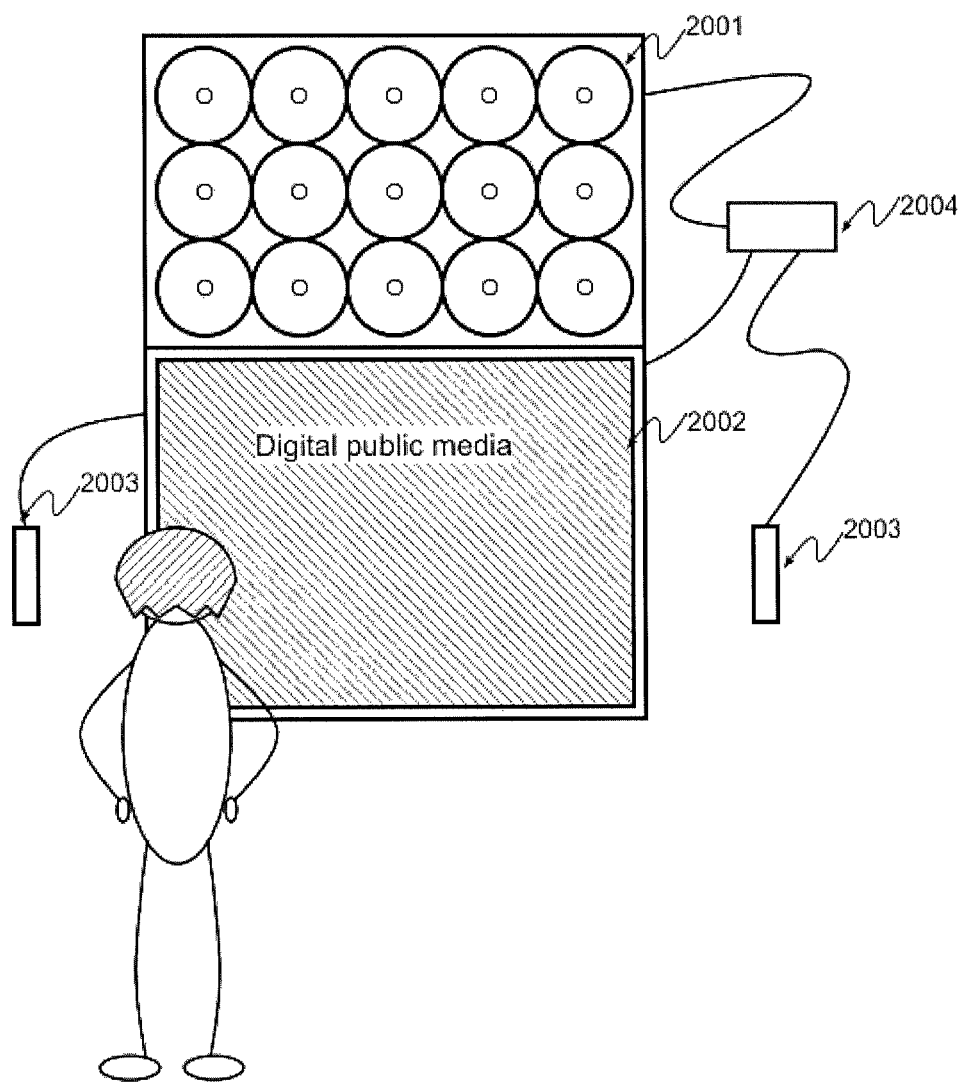
FIG. 20 is a structural diagram of a digital acoustic system related to a twentieth embodiment of the present invention.

FIG. 20 shows a twentieth embodiment of a digital acoustic system wherein a digital speaker apparatus (2001) including a circuit which outputs a plurality of digital signals by a ΔΣ modulator and a post filter circuit, a plurality of speaker driving elements, and a plurality of digital speakers, and a digital commercial display device (2002) are combined and the digital speaker apparatus is connected to a control apparatus (2004) which controls the directionality of the digital speaker apparatus (2001) according to a signal from a sensor apparatus (2003).

In the present embodiment, as in the ninth to the fourteenth embodiments, a plurality of speakers are used and the delays of signals each of which drives each speaker are controlled by a digital delay circuit as in the ninth embodiment. Consequently, the directionality of a play back sound can be changed so that it is directed towards the existence direction or location of a person or an object which is detected.

The sensor apparatus (2003) detects a certain peripheral information. For example, the sensor apparatus (2003) is a camera device and a photographed image around the periphery of the sensor (2003) is taken. By analyzing a photographed image, the existence of a person or an object in the periphery of the sensor apparatus (2003) is detected. In addition, it is also possible to detect the direction and location of a person or an object. In this case, it is possible to detect the direction and location more accurately by using the information detected by a plurality of sensor apparatuses (2003). In addition, the sensor apparatus (2003) may be an infra red sensor. In this case, infra red generated by heat of a person or an object is detected and the presence, direction and location of a person or an object are calculated according to the detection result. In addition, not only electromagnetic waves which include light but also ultrasonic sound waves generated from the digital speaker apparatus (2001) and reflected by a person or an object may be detected. In addition, by arranging a switch on the surface of a road or a floor and it is possible to detect the position of a person or object according to On/Off of the switch.

The detection result of the sensor apparatus (2003) is analyzed by the control apparatus (2004) such as a micro computer, and may be used in the control of the digital speaker apparatus (2001) and/or the digital commercial display device.

In the present embodiment, by digitally applying a delay to a signal from the ΔΣ modulator and the formatter using a delay circuit, the phase shift of a signal to each driving device is controlled by the detected direction and location. As a result, it is possible to change the directionality of an acoustic signal emitted in space. For example, in the speaker apparatus (2001), three speakers SP1, SP2, and SP3 are arranged in this order in one line at equal intervals. At this time, in the case where the distance between speakers is d, the wavelength of a signal is λs, and the angle of deviation is θ when the front of the speaker apparatus (2001) is 0 radian, if the phase of SP2 with respect to SP3 is delayed by $(2\pi d \sin\theta)/\lambda s$, and the phase of SP1 is $(4\pi d \sin\theta)/\lambda s$, it is possible to realize a directionality to the side of SP1 by θ.

It is possible to dynamically control the directionality of an audio played back by a digital speaker according to the information detected by the sensor apparatus (2003). That is, control is performed so that an audio is emitted in the direction of a location where the object which transmits audio of a person etc. exists within a certain range. The commercial display device of the present invention can effectively transmit audio information which is needed only for the object which has an interest in a commercial media, and because it is unnecessary to play back audio data at an unnecessary high volume it is possible to manage the noise problem. The present embodiment can also be applied to an exhibition explanation device such as in an art gallery or a science museum, a display device within a station, an airport, or a hotel, a notice display in public transport such a bus or a train, a premises guidance device such as a hospital or a city office, as well as a digital commercial display.

Twenty-First Embodiment

Figure 21A:
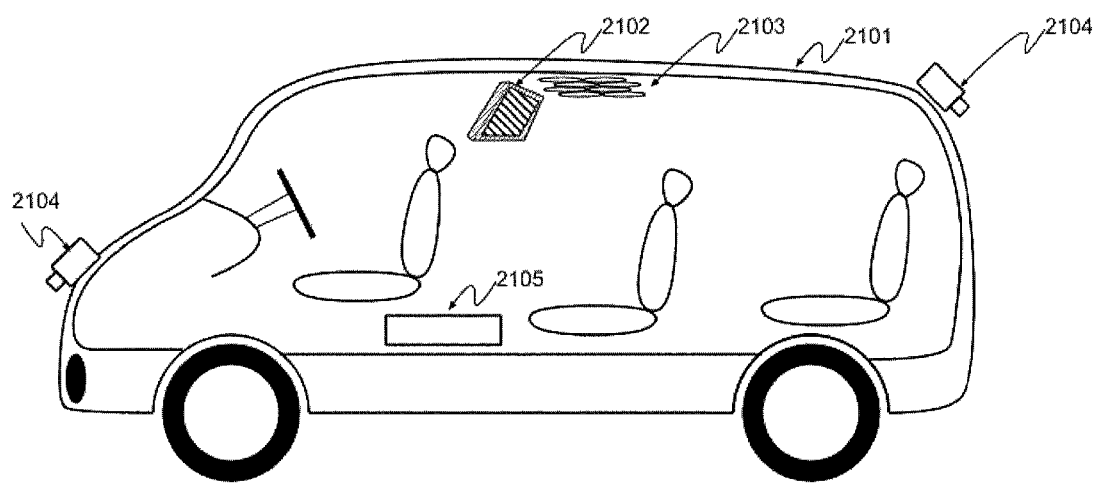
FIG. 21a is a structural diagram of a digital acoustic system related to a twenty-first embodiment of the present invention.

FIG. 21a shows a twenty-first embodiment of a digital acoustic system for a vehicle including a digital speaker apparatus (2103) wherein the digital speaker apparatus (2103) including a circuit which outputs a plurality of digital signals by a ΔΣ modulator and a post filter circuit, a plurality of speaker driving elements, and a plurality of speakers, and a display apparatus (2102) are combined and the digital speaker apparatus is configured to control the directionality. In the case of a digital speaker apparatus for a vehicle, when a rear projector is used as a display device which is mainly applied as an entertainment device (a DVD or TV device) to passengers sitting in the rear seat, it is necessary to reduce the volume to the driver depending on the situation for safety purposes. Because it is possible to dynamically control the directionality of an audio which is played back by the digital speaker of the present invention, it can also be widely applied for use in vehicles.

The situation stated above is judged based on the detection of a vibration or an acceleration by a vibration sensor or an acceleration sensor attached to the vehicle body. For example, the sensor judges whether there is a change which exceeds the size of a continuous acceleration when sharp bends continue. In addition, sound external to the vehicle is detected by a microphone and the sensor judges the presence of a siren of an emergency or a warning sound of a train crossing etc. If the sensor judges that sharp bends continue or a siren is detected, the audio of the entertainment device is controlled so that the volume is reduced as much as possible to the driver in order to allow the driver to concentrate on driving. In addition, the current position can be detected by using a GPS (Global Positioning System), whether the vehicle is travelling a dangerous route such as a mountain route can be judged, and the audio of the entertainment device is controlled so that the volume is reduced as much as possible to the driver in order to allow the driver to concentrate on driving.

Figure 21B:
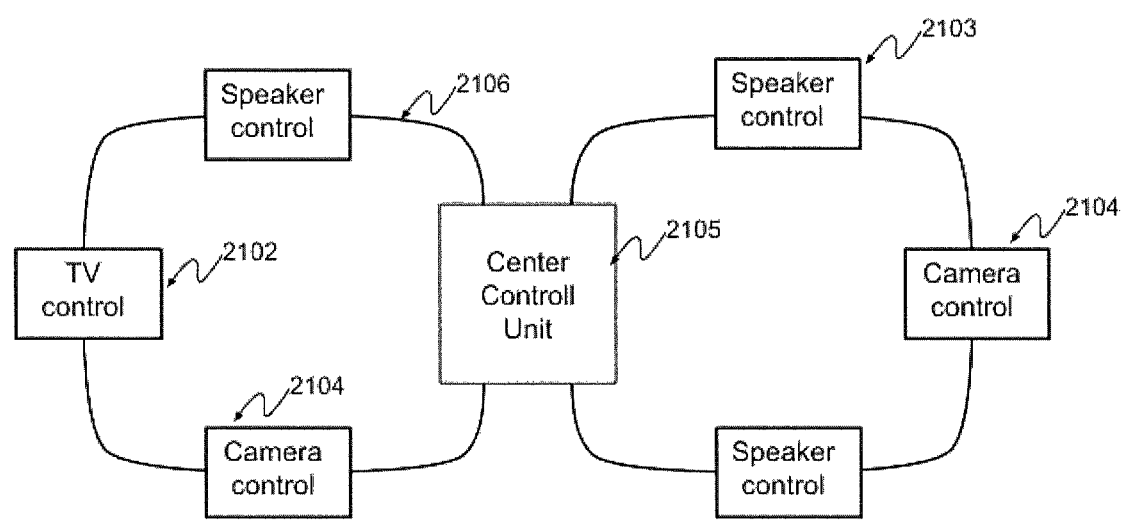
FIG. 21b is structural diagram of a centralized control apparatus (2105) and in-car LAN, which transmits a digital signal, related to one embodiment of the present invention.

As stated above, in order to monitor information external to a vehicle and construct a corresponding vehicle acoustic environment, a monitor camera (2104) etc. for monitoring the exterior of the car is arranged and is connected to a central control device (2105) and to a vehicle interior LAN (2106) to transmit a digital (optical) signal as shown in FIG. 21b. Information detected by the monitor camera (2104) etc. is analyzed by the central control device (2105) and a digital speaker is controlled based on the result of the analysis. The digital speaker of the present invention can control not only volume but also acoustic characteristics such as directionality via a digital signal. In addition, because a digital signal is used, it is possible to easily connect to the vehicle interior LAN (2106). Therefore, by connecting the digital speaker of the present invention to the vehicle interior LAN (2106) it is possible to provide a comfortable and safe vehicle for the driver and passengers.

In the present embodiment, the digital speaker of the present invention can be used not only for entertainment but also as an active noise cancelling device in order to reduce road noise. That is, road noise is detected by a microphone which is not shown in the diagram and audio with an opposite phase is generated. In addition, by controlling directionality at this time it is possible, for example, to reduce only the noise which is audible to the driver or reduce only the noise which is audible to a side and rear passenger. The present embodiment can be applied not only to a vehicle digital system but also to an airplane, a motorcycle, a bus, or trains. In addition, the present embodiment can be applied to a digital acoustic system or a noise cancelling device such as in a bed or an audio visual room of a capsule hotel or a concert hall.

To summarize the above, for example, a digital speaker driving apparatus is provided which drives a digital speaker having s number of digital signal terminals, the digital speaker driving apparatus including: a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; and a power circuit which supplies power to the ΔΣ modulator, the post filter, and the s number of driving circuits, wherein the s number of driving circuits correspond to the s number of digital signal terminals.

As the first digital speaker driving apparatus, a second digital speaker apparatus is provided including a power circuit which supplies a variable voltage to the number of driving circuits so that amplitudes of outputs of digital signals of the s number of driving circuits are adjusted.

As the first digital speaker driving apparatus, a third digital speaker driving apparatus is provided which includes a digital attenuator which adjusts the volume of the digital speaker by performing a predetermined calculation process on the digital input signal and inputting the signal to the ΔΣ modulator.

As the first or the second digital speaker driving apparatus, a fourth digital speaker drive apparatus is provided in which the power circuit is controlled according to the digital input signal.

As a digital speaker driving apparatus which is connected to digital signal terminals of a digital speaker, a fifth digital speaker driving apparatus is provided which includes a first output circuit connected to a first input terminal of the digital terminals of the digital speaker; and a second output circuit connected to a second input terminal of the digital terms of the digital speaker, the second input terminal forming a pair with the first input terminal; wherein the first output circuit and the second output circuit are input with signals, the signals being the inverse of each other.

As the fifth digital speaker driving apparatus, a sixth digital speaker driving apparatus is provided wherein the first output circuit and the second output circuit output signals of a first voltage, a second voltage, or a third voltage, in the case where the first output circuit outputs the first voltage and the second output circuit outputs the third voltage, the state of the digital signal output is in a first state, in the case where the first output circuit outputs the third voltage and the second output circuit outputs the first voltage, the state of the digital signal output is in a second state, and in the case where both of the first output circuit and the second output circuit output the second voltages, the state of the digital signal output is in a third state.

As the first digital speaker driving apparatus, a seventh digital speaker driving apparatus is provided wherein the ΔΣ modulator, the post filter, and the s number of driving circuits are formed on a single semiconductor or are sealed in a single package.

An eighth digital speaker apparatus is provided which includes a digital speaker which has a plurality of input terminals; and a digital speaker driving circuit which is connected to the input terminals and drives the digital speaker; wherein the digital speaker driving circuit is arranged just behind coils the digital speaker A ninth digital speaker apparatus is provided which includes a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; s number of speaker driving elements each of which is driven by corresponding driving circuit among the s number of driving circuits; and r number of vibration membranes which are driven by the s number of driving elements; wherein s and r are 2 or more.

A tenth digital speaker apparatus is provided which includes a ΔΣ modulator and a digital speaker a ΣΔ modulator; and a digital speaker; wherein the digital speaker has a plurality of coils each of which is driven by a different digital signal and all of which vibrate a common vibration membrane.

As the tenth digital speaker apparatus, an eleventh digital speaker apparatus is provided wherein the plurality of coils are bound together and wound.

A digital actuator is proposed which includes a magnetostrictor, and a plurality of coils which are each driven by different digital signals and which generate a magnetic field to the magnetostrictor.

A twelfth digital speaker apparatus is provided which includes a ΔΣ modulator which modulates a digital input signal and outputs an n bit digital signal; a post filter which is connected to the ΔΣ modulator and outputs an m bit digital signal obtained by miss-match shaping the n bit digital signal; s number of driving circuits to each of which one part of the m bit digital signal is input and each of which outputs a digital signal; and s number of electrostatic elements each of which is driven by a corresponding driving circuit among the s number of driving circuits.

As the twelfth digital speaker apparatus, a thirteenth digital speaker apparatus is provided wherein the ΔΣ modulator, the post filter, and the s number of driving circuits and the s number of electrostatic elements are formed on a single substrate.

As a digital speaker driving apparatus which drives a digital speaker having s number of digital signal terminals, a fourteenth digital speaker apparatus is provided which includes a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuit which delays the m bit digital signal and outputs the delayed m bit digital signal; s number of driving circuits to each of which one part of the m bit digital signal is input and each of which outputs a digital signal; wherein a delay time period of the digital delay control circuit is controlled for each output according to a control signal.

A flat display device is provided which includes a flat display; a plurality of digital speakers which are arranged in a line on at least one side of the flat display; and a delay control circuit which controls the delay time periods of driving signals supplied to the plurality of digital speakers according to a control signal.

A fifteenth digital speaker apparatus is provided which includes a port for connecting to a portable digital audio source apparatus; a circuit for processing the digital signals input to the port in a digital format; and a digital speaker driven by the circuit; wherein the digital speaker apparatus operates with a battery.

A first mobile electronic device is provided which includes a digital speaker; and a driving apparatus which drives the digital speaker without converting a digital signal to an analog signal; wherein the portable electronic device operates with a battery.

A second mobile electronic device is provided which includes a port for connecting to a portable digital audio source apparatus; a driving apparatus for processing the digital signals input to the port in a digital format; and a digital speaker driven by the driving apparatus; wherein the portable electronic device operates with a battery.

A digital speaker apparatus is provided which includes a digital speaker; a digital speaker driving apparatus for processing a digital signal without converting the digital signal to an analog signal; and a microphone; wherein the digital speaker driving apparatus operates so that a noise is cancelled based on a signal from the microphone.

A third mobile electronic device is provided which includes a wireless receiver receiving a digital signal; a digital speaker driving apparatus which generates a plurality digital signals without converting the digital signal output by the wireless receiver to an analog signal; and a digital speaker which is driven by the plurality of digital signals.

A sixteenth digital speaker driving apparatus is provided in which a digital speaker system which drives the digital speaker driving apparatus includes a ΔΣ modulator which modulates a digital input signal and outputs an n bit digital signal; a post filter which is connected to the ΔΣ modulator and outputs an m bit digital signal obtained by miss-match shaping the n bit digital signal; and s number of driving circuits each of which corresponds to one of the s pairs of digital input terminals and to each of which one part of the m bit digital signal is input and each of which outputs a digital signal; wherein each of s number of driving circuits has a first output circuit connected to a first input terminal of a corresponding digital input terminal and a second output circuit connected to a second input terminal which forms a pair with the first input terminal of a corresponding digital input terminal; and wherein the driving circuit has at least three states of digital signal output according to the combination of a first digital signal input to the first output circuit and a second digital signal input to the second output circuit.

As the sixteenth digital speaker drive apparatus, a seventeenth digital speaker drive apparatus is provided wherein a digital signal which is input to the ΔΣ modulator is obtained from one bit input signal to p bit by serial/parallel conversion and by oversampling to signals of bits the number of which is larger than n and p.

As the seventeenth digital speaker drive apparatus, an eighteenth digital speaker drive apparatus is provided wherein the driving circuit is in a sate in which the voltage of the first input terminal and the voltage of the second input terminal become equal when the first digital signal and the second digital signal are the same.

In the eighteenth digital speaker drive apparatus, a nineteenth digital speaker drive apparatus is provided wherein each of the first output circuit and the second output circuit includes a first source transistor and a first sink transistor which are connected in series with the first digital signal which is input, and a second source transistor and a second sink transistor which are connected in series with the second digital signal which is input, wherein a connection point between the first source transistor and the first sink transistor and a connection point between the second source transistor and the second sink transistor form an H bridge circuit which is connected to a corresponding digital signal terminal.

In the nineteenth digital speaker drive apparatus, a twentieth digital speaker drive apparatus is provided which includes a peak detector which calculates an amplitude of audio represented by the digital input signal; wherein the post filter controls the number of bits of an output digital signal according to the amplitude calculated by the peak detector.

In the twentieth digital speaker drive apparatus, a twenty-first digital speaker drive apparatus is provided wherein the post filter outputs a digital signal with fewer bits the lower the amplitude calculated by the peak detector.

In the twenty-first digital speaker driving apparatus, a twenty-second digital speaker drive apparatus is provided which drives a plurality of digital speakers having s number of digital signal terminals, and includes a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuits which delays the m bit digital signal and outputs the delayed m bit digital signal; s number of driving circuits to each of which a part of the delayed m bit digital signal is input and each of which outputs a digital signal; and a sensor which senses information related to a person or an object which exists in a periphery; wherein a delay time period of the digital delay control circuit is controlled according to a control signal generated based on the information sensed by the sensor, and the directionality of audio played back by the plurality of digital speakers is controlled to a direction or position of the person or the object detected by the sensor.

As the twenty-second digital speaker driving apparatus, a twenty-third digital speaker driving apparatus is provided wherein the sensor is a camera or an infra read sensor which photographs periphery images.

As the twenty-third digital speaker driving apparatus, a twenty-fourth digital speaker driving apparatus is provided wherein the sensor is an ultrasound sensor.

As the twenty-fourth digital speaker drive apparatus, a twenty-fifth digital speaker drive apparatus is provided wherein all or one part of the plurality of digital speakers generate ultrasound detected by the sensor.

As a digital speaker driving apparatus which drives a digital speaker having s number of digital signal terminals, a twenty-fifth digital speaker driving apparatus is provided including a ΔΣ modulator which modulates a digital input signal and outputs an n bit digital signal; a post filter which is connected to the ΔΣ modulator and outputs an m bit digital signal obtained by miss-match shaping the n bit digital signal; a digital delay control circuit which delays the m bit digital signal and outputs the delayed m bit digital signal; s number driving circuits to each of which a part of the delayed m bit digital signal is input and each of which outputs a digital signal; and a microphone which detects a sound in a periphery; wherein an audio of an opposite phase to the sound detected by the microphone is generated by the digital speaker.

As the twenty-sixth digital speaker driving apparatus, a twenty-seventh digital speaker driving apparatus is provided wherein another digital speaker is arranged, and includes a plurality of digital speakers, wherein the digital delay control circuit outputs m bit digital signal which is delayed for each digital speaker by controlling the delay time period of the m bit digital signal input.

What is claimed is:

1. A digital speaker system driving a digital speaker having s pairs of digital input terminals, comprising:
   a ΔΣ modulator which modulates a digital input signal and outputs an n bit digital signal;
   a post filter which is connected to the ΔΣ modulator and outputs an m bit digital signal obtained by miss-match shaping the n bit digital signal;
   s number of driving circuits each of which corresponds to one of the s pairs of digital input terminals and to each of which one part of the m bit digital signal is input and each of which outputs a digital signal; and
   a power circuit which supplies power to the ΔΣ modulator, the post filter, and the s number of driving circuits;
   wherein each of s number of driving circuits has a first output circuit connected to a first input terminal of a corresponding digital input terminal and a second output circuit connected to a second input terminal which forms a pair with the first input terminal of a corresponding digital input terminal; and
   wherein the driving circuit has at least three states of digital signal output according to the combination of a first digital signal input to the first output circuit and a second digital signal input to the second output circuit.

2. The digital speaker driving apparatus according to claim 1, wherein a digital signal which is input to the ΔΣ modulator is obtained from one bit input signal to p bit by serial/parallel conversion and by oversampling to signals of bits the number of which is larger than n and p.

3. The digital speaker driving apparatus according to claim 1,
   wherein the driving circuit is in a state in which the voltage of the first input terminal and the voltage of the second input terminal become equal when the first digital signal and the second digital signal are the same.

4. The digital speaker driving apparatus according to claim 3,
   wherein each of the first output circuit and the second output circuit includes a first source transistor and a first sink transistor which are connected in series with the first digital signal which is input, and a second source transistor and a second sink transistor which are connected in series with the second digital signal which is input, wherein a connection point between the first source transistor and the first sink transistor and a connection point between the second source transistor and the second sink transistor form an H bridge circuit which is connected to a corresponding digital signal terminal.

5. The digital speaker driving apparatus according to claim 1, further comprising a peak detector which calculates an amplitude of audio represented by the digital input signal,
   wherein the post filter controls the number of bits of an output digital signal according to the amplitude calculated by the peak detector.

6. The digital speaker driving apparatus according to claim 5, wherein the post filter outputs a digital signal with fewer bits to lower the amplitude calculated by the peak detector.

7. The digital speaker driving apparatus according to claim 1, further comprising:
   a digital attenuator which adjusts the volume of the digital speaker by performing a predetermined calculation process on the digital input signal and inputting the signal to the ΔΣ modulator.

8. The digital speaker driving apparatus according to claim 1, wherein the ΔΣ modulator, the post filter, and the s number of driving circuits are formed on a single semiconductor or are sealed in a single package.

9. The digital speaker driving apparatus according to claim 1, wherein the power circuit supplies a variable voltage to the s number of driving circuits so that amplitudes of outputs of digital signals of the s number of driving circuits are adjusted.

10. The digital speaker driving apparatus according to claim 1, wherein the power circuit is controlled according to the digital input signal.

11. A digital speaker driving apparatus driving a plurality of digital speakers each having s number of digital signal terminals, the apparatus comprising:
a ΔΣ modulator which modulates a digital input signal and outputs an n bit digital signal;
a post filter which is connected to the ΔΣ modulator and outputs an m bit digital signal obtained by miss-match shaping the n bit digital signal;
a digital delay control circuits which delays the m bit digital signal and outputs the delayed m bit digital signal;
s number of driving circuits to each of which a part of the delayed m bit digital signal is input and each of which outputs a digital signal;
a power circuit which supplies power to the ΔΣ modulator, the post filter, and the s number of driving circuits; and
a sensor which senses information related to a person or an object which exists in a periphery;
wherein a delay time period of the digital delay control circuit is controlled according to a control signal generated based on the information sensed by the sensor, and the directionality of audio played back by the plurality of digital speakers is controlled to a direction or position of the person or the object detected by the sensor.

12. The digital speaker driving apparatus according to claim 11, wherein the sensor is a camera or an infra read sensor which photographs a periphery image.

13. The digital speaker driving apparatus according to claim 11, wherein the sensor is an ultrasound sensor.

14. The digital speaker driving apparatus according to claim 13, wherein all or one part of the plurality of digital speakers generate ultrasound detected by the sensor.

15. The digital speaker driving apparatus according to claim 11, further comprising:
a digital attenuator which adjusts the volume of the digital speaker by performing a predetermined calculation process on the digital input signal and inputting the signal to the A modulator.

16. The digital speaker driving apparatus according to claim 11, wherein the ΔΣ modulator, the post filter, and the s number of driving circuits are formed on a single semiconductor or are sealed in a single package.

17. The digital speaker driving apparatus according to claim 11, wherein the power circuit supplies a variable voltage to the s number of driving circuits so that amplitudes of outputs of digital signals of the s number of driving circuits are adjusted.

18. The digital speaker driving apparatus according to claim 11, wherein the power circuit is controlled according to the digital input signal.

19. A digital speaker driving apparatus driving a digital speaker having s number of digital signal terminals, comprising:
a ΔΣ modulator which modulates a digital input signal and outputs an n bit digital signal;
a post filter which is connected to the ΔΣ modulator and outputs an m bit digital signal obtained by miss-match shaping the n bit digital signal;
a digital delay control circuit which delays the m bit digital signal and outputs the delayed m bit digital signal;
s number driving circuits to each of which a part of the delayed m bit digital signal is input and each of which outputs a digital signal;
a power circuit which supplies power to the ΔΣ modulator, the post filter, and the s number of driving circuits; and
a microphone which detects a sound in a periphery;
wherein an audio of an opposite phase to the sound detected by the microphone is generated by the digital speaker,
wherein each of the s number driving circuits has a first output circuit connected to a first input terminal of a digital signal terminal corresponding to each of the s number of driving circuits and a second output circuit connected to a second input terminal which forms a pair with the first input terminal of the digital terminal, and
wherein the driving circuit has at least three states of digital signal output according to the combination of a first digital signal input to the first output circuit and a second digital signal input to the second output circuit.

20. The digital speaker driving apparatus according to claim 19, further comprising another digital speaker,
wherein the digital delay control circuit outputs m bit digital signal which is delayed for each digital speaker by controlling the delay time period of the m bit digital signal input.

21. The digital speaker driving apparatus according to claim 19, further comprising:
a digital attenuator which adjusts the volume of the digital speaker by performing a predetermined calculation process on the digital input signal and inputting the signal to the ΔΣ modulator.

22. The digital speaker driving apparatus according to claim 19 wherein the ΔΣ modulator, the post filter, and the s number of driving circuits are formed on a single semiconductor or are sealed in a single package.

23. The digital speaker driving apparatus according to claim 19 wherein the power circuit supplies a variable voltage to the s number of driving circuits so that amplitudes of outputs of digital signals of the s number of driving circuits are adjusted.

24. The digital speaker driving apparatus according to claim 19 wherein the power circuit is controlled according to the digital input signal.

25. A digital speaker apparatus driving a digital speaker having s number digital signal terminals, comprising:
a ΔΣ modulator which modulates a digital input signal and outputs an n bit digital signal;
a post filter which is connected to the ΔΣ modulator and outputs an m bit digital signal obtained by miss-match shaping the n bit digital signal;
a digital delay control circuit which delays the m bit digital signal and outputs the delayed m bit digital signal;
s number of driving circuits to each of which one part of the m delayed bit digital signal is input and each of which outputs a digital signal; and
a power circuit which supplies power to the ΔΣ modulator, the post filter, and the s number of driving circuits;
wherein a delay time period of the digital delay control circuit is controlled for each output according to a control signal,
wherein each of the s number of driving circuits has a first output circuit connected to a first input terminal of a digital signal terminal corresponding to each of the s number of driving circuits and a second output circuit connected to a second input terminal which forms a pair with the first input terminal of the digital terminal, and wherein the driving circuit has at least three states of digital signal output according to the combination of a first digital signal input to the first output circuit and a second digital signal input to the second output circuit.

26. The digital speaker driving apparatus according to claim 25, further comprising:
a digital attenuator which adjusts the volume of the digital speaker by performing a predetermined calculation process on the digital input signal and inputting the signal to the $\Delta\Sigma$ modulator.

27. The digital speaker driving apparatus according to claim 25 wherein the $\Delta\Sigma$ modulator, the post filter, and the s number of driving circuits are formed on a single semiconductor or are sealed in a single package.

28. The digital speaker driving apparatus according to claim 25 wherein the power circuit supplies a variable voltage to the s number of driving circuits so that amplitudes of outputs of digital signals of the s number of driving circuits are adjusted.

29. The digital speaker driving apparatus according to claim 25 wherein the power circuit is controlled according to the digital input signal.

* * * * *